(12) United States Patent
Takano et al.

(10) Patent No.: US 11,742,273 B2
(45) Date of Patent: Aug. 29, 2023

(54) THROUGH ELECTRODE SUBSTRATE AND SEMICONDUCTOR DEVICE

(71) Applicant: DAI NIPPON PRINTING CO., LTD., Tokyo (JP)

(72) Inventors: Takamasa Takano, Tokyo (JP); Satoru Kuramochi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/168,631

(22) Filed: Feb. 5, 2021

(65) Prior Publication Data

US 2021/0159153 A1 May 27, 2021

Related U.S. Application Data

(63) Continuation of application No. 16/447,003, filed on Jun. 20, 2019, now Pat. No. 10,950,533, which is a
(Continued)

(30) Foreign Application Priority Data

Dec. 21, 2016 (JP) ................................. 2016-248415
Mar. 1, 2017 (JP) ................................. 2017-038412
May 22, 2017 (JP) ................................. 2017-100924

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 23/12* (2013.01);
(Continued)

(58) Field of Classification Search
CPC . H01L 23/49827; H01L 21/486; H01L 23/12; H01L 23/49816; H01L 23/49833;
(Continued)

(56) References Cited

U.S. PATENT DOCUMENTS 4,490,429 A * 12/1984 Tosaki ................. H05K 1/0306
501/6
4,871,583 A * 10/1989 Monnier ............. H01L 23/5384
29/842

(Continued)

FOREIGN PATENT DOCUMENTS

JP       S63-082953 U    5/1988
JP       63244761 A     10/1988
(Continued)

OTHER PUBLICATIONS

Aug. 31, 2021 Office Action issued in Japanese Application No. 2018-137740.
(Continued)

*Primary Examiner* — Ahmed N Sefer
(74) *Attorney, Agent, or Firm* — Oliff PLC

(57) ABSTRACT

A through electrode substrate includes: a substrate having a first surface and a second surface facing the first surface; through electrodes penetrating through the substrate; and a first capacitor including a first conductive layer, an insulating layer, and a second conductive layer, arranged on the first surface side of the substrate, and electrically connected with at least one of the through electrodes. The first conductive layer is arranged on the first surface side of the substrate and is electrically connected with the through electrode. The insulating layer includes a first part and a second part and is arranged on the first conductive layer. The second conductive layer is arranged on the insulating layer. The first part is arranged between the first conductive layer
(Continued)

and the second conductive layer. The second part covers at least a part of a side surface of the first conductive layer.

15 Claims, 22 Drawing Sheets

Related U.S. Application Data continuation of application No. PCT/JP2017/045575, filed on Dec. 19, 2017.

(51) Int. Cl.
| | |
|---|---|
| H01L 23/538 | (2006.01) |
| H01L 23/00 | (2006.01) |
| H01L 25/065 | (2023.01) |
| H01L 25/16 | (2023.01) |
| H01L 49/02 | (2006.01) |
| H05K 1/11 | (2006.01) |
| H01L 23/12 | (2006.01) |
| H05K 3/28 | (2006.01) |

(52) U.S. Cl.
CPC .. *H01L 23/49816* (2013.01); *H01L 23/49833* (2013.01); *H01L 23/49838* (2013.01); *H01L 23/5384* (2013.01); *H01L 23/5386* (2013.01); *H01L 24/16* (2013.01); *H01L 24/48* (2013.01); *H01L 24/73* (2013.01); *H01L 25/0652* (2013.01); *H01L 25/0657* (2013.01); *H01L 25/16* (2013.01); *H01L 28/10* (2013.01); *H01L 28/40* (2013.01); *H01L 28/60* (2013.01); *H05K 1/11* (2013.01); *H05K 3/28* (2013.01); *H01L 2224/16227* (2013.01); *H01L 2224/48091* (2013.01); *H01L 2224/48106* (2013.01); *H01L 2224/48225* (2013.01); *H01L 2224/73257* (2013.01); *H01L 2225/0651* (2013.01); *H01L 2225/06517* (2013.01); *H01L 2225/06548* (2013.01); *H01L 2225/06572* (2013.01); *H01L 2924/19011* (2013.01); *H01L 2924/19041* (2013.01); *H01L 2924/19042* (2013.01)

(58) Field of Classification Search
CPC ........... H01L 23/49838; H01L 23/5384; H01L 23/5386; H01L 24/16; H01L 24/48; H01L 24/73; H01L 25/0652; H01L 25/0657; H01L 25/16; H01L 28/10; H01L 28/40; H01L 28/60; H05K 1/11; H05K 3/28

See application file for complete search history.

(56) References Cited

U.S. PATENT DOCUMENTS

| | | | |
|---|---|---|---|
| 5,752,182 A | 5/1998 | Nakatsuka et al. | |
| 6,265,671 B1 | 7/2001 | Matsuno | |
| 6,317,948 B1* | 11/2001 | Kola ................. | H05K 1/162 29/25.42 |
| 2002/0003261 A1 | 1/2002 | Murata et al. | |
| 2002/0054467 A1* | 5/2002 | Tsai .................. | H01L 23/49827 361/302 |
| 2002/0132898 A1 | 9/2002 | Takaya et al. | |
| 2003/0088978 A1* | 5/2003 | Takano ............... | H05K 1/162 29/846 |
| 2003/0219956 A1 | 11/2003 | Mori et al. | |
| 2004/0144476 A1* | 7/2004 | Fukuta ............... | H01L 21/4857 257/E23.062 |
| 2004/0246692 A1* | 12/2004 | Satoh ................ | H01L 27/016 257/E27.113 |
| 2005/0012217 A1* | 1/2005 | Mori ................. | H01L 23/49822 257/E23.062 |
| 2005/0111162 A1 | 5/2005 | Osaka et al. | |
| 2005/0269206 A1 | 12/2005 | Tanaka et al. | |
| 2006/0051978 A1 | 3/2006 | Li et al. | |
| 2006/0151863 A1 | 7/2006 | Das et al. | |
| 2006/0180938 A1 | 8/2006 | Kurihara et al. | |
| 2006/0211212 A1 | 9/2006 | Baniecki et al. | |
| 2007/0141800 A1* | 6/2007 | Kurihara ............ | H01L 24/05 257/E23.079 |
| 2007/0178412 A1 | 8/2007 | Jung et al. | |
| 2007/0253144 A1 | 11/2007 | Kuwajima | |
| 2007/0275525 A1 | 11/2007 | Das et al. | |
| 2008/0134499 A1* | 6/2008 | Shioga ............... | H01L 23/645 257/E23.079 |
| 2008/0247116 A1 | 10/2008 | Kawano et al. | |
| 2010/0117127 A1* | 5/2010 | Kumura ............ | H01L 27/11507 257/295 |
| 2010/0224925 A1 | 9/2010 | Ching et al. | |
| 2010/0246090 A1 | 9/2010 | Yoshizawa et al. | |
| 2013/0270675 A1 | 10/2013 | Childs et al. | |
| 2014/0097890 A1 | 4/2014 | Li et al. | |
| 2014/0159200 A1 | 6/2014 | Loke et al. | |
| 2015/0294936 A1 | 10/2015 | Shen et al. | |

FOREIGN PATENT DOCUMENTS

| | | |
|---|---|---|
| JP | S63-244761 A | 10/1988 |
| JP | H07-272932 A | 10/1995 |
| JP | H08-32018 A | 2/1996 |
| JP | H9-130056 A | 5/1997 |
| JP | H10-27952 A | 1/1998 |
| JP | H10-51141 A | 2/1998 |
| JP | H11-260148 A | 9/1999 |
| JP | 2000-223316 A | 8/2000 |
| JP | 2002-025854 A | 1/2002 |
| JP | 2003-152340 A | 5/2003 |
| JP | 2003-234595 A | 8/2003 |
| JP | 2004-071872 A | 3/2004 |
| JP | 2005-159259 A | 6/2005 |
| JP | 2006024902 A | 1/2006 |
| JP | 2007019292 A | 1/2007 |
| JP | 2007-300002 A | 11/2007 |
| JP | 2008-227177 A | 9/2008 |
| JP | 2009-295843 A | 12/2009 |
| JP | 2011-155043 A | 8/2011 |
| JP | 2015-095590 A | 5/2015 |
| TW | 552686 B | 9/2003 |
| TW | 200802443 A | 1/2008 |
| TW | 201320305 A | 5/2013 |
| WO | 2003/007379 A1 | 1/2003 |
| WO | 2005/034594 A1 | 4/2005 |

OTHER PUBLICATIONS

Aug. 6, 2021 Office Action issued in Taiwan Application No. 106144777.
Mar. 6, 2018 International Search Report issued in International Patent Application No. PCT/JP2017/045575.
Mar. 6, 2018 Written Opinion issued in International Patent Application No. PCT/JP2017/045575.
Oct. 10, 2017 Office Action issued in Japanese Patent Aplication No. 2017-100924.
Office Action issued in U.S. Appl. No. 16/447,003 dated May 29, 2020.
Mar. 8, 2022 Office Action issued in Japanese Patent Application No. 2018-137740.
Nov. 30, 2022 Office Action issued in Taiwanese Patent Application No. 111118041.
Aug. 17, 2022 Office Action issued in Taiwanese Patent Application No. 111118041.
May 25, 2023 Office Action issued in Taiwanese Patent Appiication No. 111118041.
Jul. 4, 2023 Notice of Allowance issued in Japanese Patent Application No. 2022-150556.

* cited by examiner

THROUGH ELECTRODE SUBSTRATE AND SEMICONDUCTOR DEVICE

CROSS REFERENCE TO RELATED APPLICATIONS

This application is a continuation of U.S. patent application Ser. No. 16/447,003, filed Jun. 20, 2019, which is a U.S. continuation application filed under 35 U.S.C. § 111(a), of International Application No. PCT/JP2017/045575, filed on Dec. 19, 2017, which claims priority to Japanese Patent Application No. 2016-248415, filed on Dec. 21, 2016, Japanese Patent Application No. 2017-038412, filed on Mar. 1, 2017, and Japanese Patent Application No. 2017-100924, filed on May 22, 2017, the disclosures of which are incorporated by reference.

FIELD

The present disclosure relates to a through electrode substrate, a semiconductor device and a manufacturing method of the through electrode substrate.

BACKGROUND

In a recent electronic device, a configuration in which wirings are used on both surfaces of a substrate is used. In Patent Literature 1 (WO 2005/034594), a substrate in which wirings on both surfaces of the substrate are connected by an electrode that penetrates through a glass substrate is disclosed.

SUMMARY

According to the present disclosure, a through electrode substrate is provided, the substrate including: a substrate having a first surface and a second surface facing the first surface; a plurality of through electrodes penetrating through the substrate; and a first capacitor arranged on the first surface side of the substrate and electrically connected with at least one of the plurality of through electrodes. The first capacitor includes a first conductive layer arranged on the first surface side of the substrate and electrically connected with the through electrode. an insulating layer arranged on the first conductive layer; and a second conductive layer arranged on the insulating layer. The insulating layer includes a first part arranged between the first conductive layer and the second conductive layer, and a second part covering at least a part of a side surface of the first conductive layer.

According to another example of the present disclosure, a manufacturing method of a through electrode substrate is provided, the method including: providing a substrate having a first surface and a second surface facing the first surface and including a through hole penetrating through the first surface and the second surface; forming a through electrode conducting between the first surface and the second surface in the through hole of the substrate and a first conductive layer electrically connected with the through electrode on the first surface of the substrate; forming a first insulating layer on an upper surface of the first conductive layer; forming a second insulating layer so as to cover at least a part of a side surface of the first conductive layer and the first insulating layer; removing a part of the second insulating layer positioned above the first conductive layer; and forming a second conductive layer on a part from which the second insulating layer was removed.

According to still another example of the present disclosure, a manufacturing method of a through electrode substrate is provided, the method including: providing a substrate having a first surface and a second surface facing the first surface and including a through hole penetrating through the first surface and the second surface; forming a first resist on the first surface; forming the through electrode conducting between the first surface and the second surface in the through hole of the substrate and a first conductive layer electrically connected with the through electrode on the first surface of the substrate; forming an intermediate layer on the first conductive layer; removing the first resist by lift-off; forming a second resist in the surrounding of the first conductive layer; forming a first insulating layer on an upper surface and a side surface of the intermediate layer, a side surface of the first conductive layer, the first surface, and an upper surface and a side surface of the second resist; removing the second resist by the lift-off so as to leave at least a part of the first insulating layer formed on the side surface of the second resist; and forming a second conductive layer on the first insulating layer corresponding to a position of the intermediate layer.

According to still another example, a manufacturing method of a through electrode substrate is provided, the method including providing a substrate having a first surface and a second surface facing the first surface and including a through hole penetrating through the first surface and the second surface; forming a first resist on the first surface; forming a through electrode conducting between the first surface and the second surface in the through hole of the substrate and a first conductive layer electrically connected with the through electrode on the first surface of the substrate; forming a first insulating layer on an upper surface and a side surface of the first conductive layer, and the first surface; forming a second conductive layer on the first insulating layer corresponding to a position of the upper surface of the first conductive layer; forming a second resist layer so as to cover the second conductive layer and to cover a part of the first insulating layer on the first surface; removing a part of the first insulating layer that is not covered with the second resist layer; and removing the second resist layer.

The through electrode substrate may be used also as an interposer.

Further features relating the present disclosure are made obvious from description of the present specification, and attached drawings. Problems, constitutions and effects other than those described above may be made obvious from description of the following embodiments.

DESCRIPTION OF EMBODIMENTS

Figure 1:
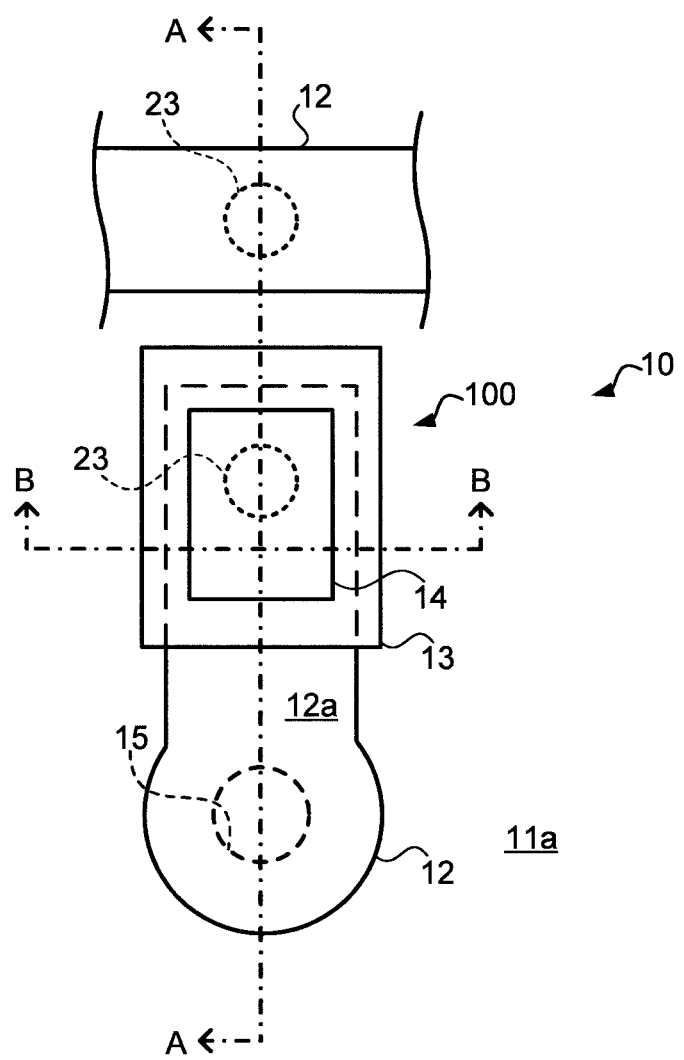
FIG. 1 is a schematic plan view showing an interposer according to a first embodiment of the present disclosure.

In what follows, one embodiment of the present disclosure will be described with reference to the drawings. In addition, each of embodiments shown below is an example of embodiments of the present invention and the present invention should not be construed as being limited to these embodiments. In the drawings referred to in the present embodiment, the same part or a part having a similar function is imparted with the same mark or the similar mark (a mark provided with only A or B after a number), and repetition of explanation thereof may be omitted. Furthermore, a dimensional ratio of the drawing may be different from an actual ratio from the convenience of explanation, or a part of a configuration may be omitted from the drawing. In the drawings attached in the present specification, from the convenience of representation and understanding, a scale and a dimensional ratio of height and length may be changed or exaggerated from that of an actual substance, or a part of the constitution may be omitted from the drawing.

In the present specification or the like, a numerical range described with "to" means a range that includes numerical values described before and after the "to" as a lower limit and an upper limit respectively. For example, "10 to 30" means 10 or larger and 30 or smaller.

First Embodiment

Figure 2:
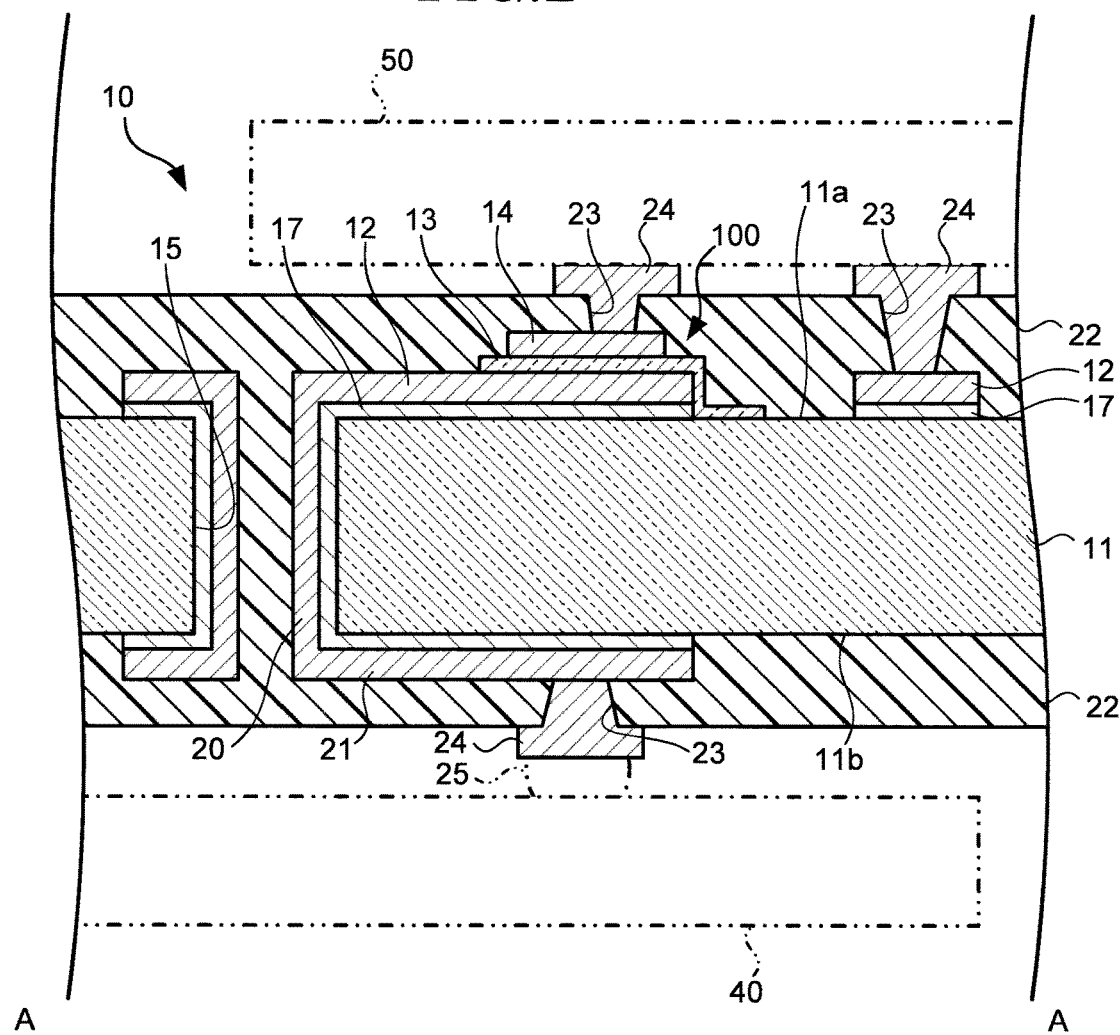
FIG. 2 is a schematic cross-sectional view (an A-A line cross-sectional view of FIG. 1) showing the interposer according to the first embodiment of the present disclosure.
Figure 3:
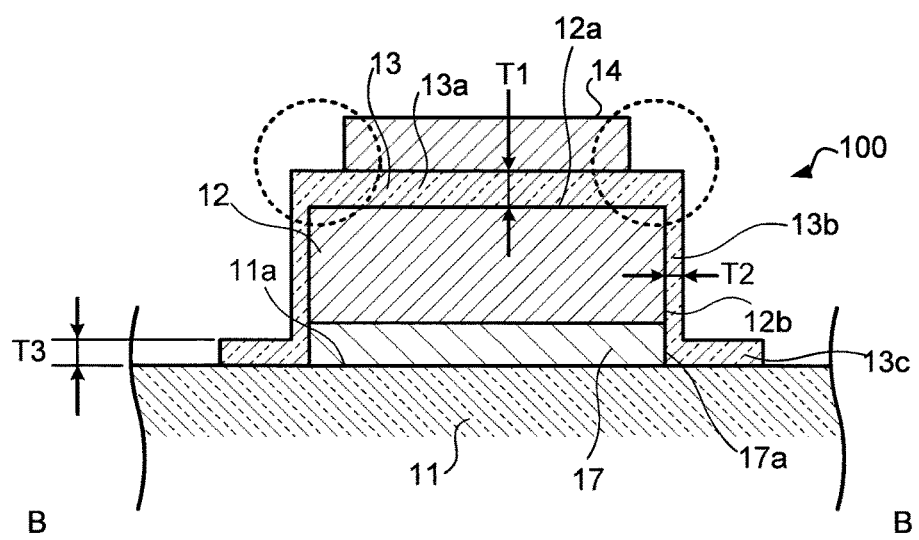
FIG. 3 is a schematic cross-sectional view (a B-B line cross-sectional view of FIG. 1) showing a capacitor 100 included in the interposer according to the first embodiment of the present disclosure.

An interposer according to one embodiment of the present disclosure has a structure where an insulating layer is sandwiched between conductive layers including a metal. FIG. 1 is a schematic plan view showing an interposer 10 according to a first embodiment of the present disclosure. FIG. 2 is a schematic cross-sectional view (an A-A line cross-sectional view of FIG. 1) showing the interposer 10 in the first embodiment of the present disclosure. FIG. 3 is a schematic cross-sectional view (a B-B line cross-sectional view of FIG. 1) showing a capacitor 100 included in the interposer 10 according to the first embodiment of the present disclosure. In addition, in FIG. 1 and FIG. 3, a part of a constitution is omitted so as to make it easy to understand a positional relationship of the substrate 11, the first conductive layer 12, a first insulating layer 13 and a second conductive layer 14. The interposer 10 has, for example, a MIM (Metal-Insulator-Metal) structure in which an insulating layer is sandwiched with a metal. In what follows, the MIM structure will be described as a capacitor 100 in which an insulating layer that is a dielectric layer is sandwiched by an upper electrode and a lower electrode. In this case, the first conductive layer 12 is used as the lower electrode, the first insulating layer 13 is used as the dielectric layer, and the second conductive layer 14 is used as the upper electrode.

The interposer 10 includes the substrate 11 having a first surface 11a and a second surface 11b facing to the first surface 11a, a first conductive layer 12 arranged on the first surface 11a of the substrate 11, a first insulating layer 13 arranged on the first conductive layer 12, and a second conductive layer 14 arranged on the first insulating layer 13. In this example, a ground layer 17 is further arranged between the first conductive layer 12 and the substrate 11. In addition, the ground layer 17 may be directly arranged on the first surface 11a of the substrate 11, or may be arranged on the first surface 11a of the substrate 11 via at least one layer of a conductive layer or an insulating layer. For example, when an insulating resin selected from epoxy, polyimide, polybenzoxazole, and polyamide is arranged on the first surface 11a of the substrate 11, the stress generated due to a difference of the thermal expansion coefficients of the first conductive layer 12 and the substrate 11 may be alleviated. Therefore, in the later processes including heating, the crack may be suppressed from occurring on the substrate.

The substrate 11 has a through hole 15 that penetrates through the first surface 11a and the second surface 11b. The first conductive layer 12 is electrically connected to a third conductive layer 21 arranged on the second surface 11b via a through electrode 20 formed in the through hole 15. Also between the through electrode 20 and the substrate 11 and between the third conductive layer 21 and the substrate 11, the ground layer 17 is arranged. A shape of the through hole 15 may have, without limiting to what is shown in the drawing, a shape where, as the through hole 15 goes toward a center part in a thickness direction of the substrate 11 from the first surface 11a and the second surface 11b of the substrate 11, a width becomes smaller, or a sidewall of the through hole 15 may expand along a normal line direction of the first surface 11a of the substrate 11 or may become narrower along the normal line direction of the first surface 11a of the substrate 11, or a part of the sidewall may have a curved shape. The through hole 15 may be formed by applying a process such as an etching process, a laser process, a combinatory process of the laser process and etching process, a sand blast process, a discharge process, or a drilling process, on the substrate 11. The through electrode 20 may have a shape where the conductive material is filled in the through hole 15, without limiting to a shape where a conductive material is arranged along a side surface of the through hole 15 as shown in FIG. 2. Furthermore, the first conductive layer 12, the through electrode 20 and the third conductive layer may be integrated to form a structure. In the interposer 10 of FIG. 2, the first conductive layer 12, the through electrode 20 and the third conductive layer 21 have the same constitution. As the same constitution, for example, a constitution formed of the same material may be used. Furthermore, the first conductive layer 12 on the first surface 11a of the substrate 11 and the third conductive layer 21 on the second surface 11b of the substrate 11 may be formed of the same material and may have a substantially same thickness. In such case, when electrically connected, a difference of resistance values is difficult to be generated at the connection part, and the transmission loss of signal may be alleviated.

In addition, an aperture width of the through hole 15 is preferably 40 μm to 110 μm. Here, the aperture width of the through hole 15 means a maximum distance between optional two points of an outer edge of a figure that an outer edge of the through hole 15 forms when the first surface 11a or the second surface 11b of the substrate 11 is seen in plan view. In addition, when the figure of which outer edge forms is a circle, the above-described width means a diameter of the circle.

On the first surface 11a side and the second surface 11b side of the substrate 11, a resin layer 22 having insulation property is formed. In the resin layer 22, at positions corresponding to the first conductive layer 12, the second conductive layer 14 and the third conductive layer 21, via holes 23 are formed. In each of the via holes 23, a connection part 24 formed of a conductive material is arranged. The connection part 24 is electrically connected with a conductive layer arranged on a bottom part of the via hole 23.

The interposer 10 is electrically connected with a semiconductor chip 50 via the connection part 24. Furthermore, the interposer 10 is connected with a wiring board 40 via the connection part 24 and a solder ball 25. Also the semiconductor chip 50 may be connected with the connection part 24 via the solder ball 25. According to this constitution, a semiconductor device having the interposer 10, the semiconductor chip 50 arranged on the first surface 11a side of the substrate 11 and electrically connected with the through electrode 20, and the wiring board 40 arranged on the second surface 11b side of the substrate 11 and electrically connected with the through electrode 20 is provided. According to the interposer 10 of the present embodiment, the semiconductor chip 50 having a narrow terminal pitch is facilitated to mount on a large wiring board 40. As the wiring board 40, for example, a mother board may be used. The connection with the semiconductor chip 50 may be realized via the large wiring board 40 without via the connection part 42. In this case, the through electrode substrate of the present invention is positioned as a receiving element not as the interposer.

Examples of the substrate 11 include a glass substrate, a glass ceramic substrate, a quartz substrate, a sapphire substrate, a resin substrate, a glass epoxy substrate, a silicon substrate, a SOI (Silicon on Insulator) substrate, a SOS (Silicon on Sapphire) substrate, a silicon carbide (SiC) substrate, a gallium arsenide (GaAs) substrate, an Indium phosphide (InP) substrate, an alumina ($Al_2O_3$) substrate, an aluminum nitride (AlN) substrate, a zirconium oxide ($ZrO_2$) substrate, and substrates obtained by stacking these. In addition, the substrate 11 is preferable to have insulation property and at least a surface has the insulation property.

Preferably, the substrate 11 is a glass substrate. In general, the interposer has a larger displacement due to the thermal deformation as a region goes closer to its edge. In the case of the interposer that uses the glass substrate, to this region, there is an advantage capable of coping with such that a difference of the thermal expansion coefficient with that of the semiconductor chip that uses the silicon substrate arranged on the interposer may be made smaller. Furthermore, when the glass is used in the substrate 11, there is no need of taking care of a leakage current between the conductive layers formed on a surface of the substrate 11 due to high insulating property.

More preferably, alkali-free glass is used as the substrate 11. Since the alkali-free glass does not contain an alkali component such as Na, K or the like different from soda glass, the alkali component does not deposit on a glass surface. Accordingly, in this aspect, there is an advantage such that a reliability deteriorating factor that corrodes a terminal of the semiconductor chip to be connected to the interposer is not generated in principle. Furthermore, the alkali-free glass has a substantially same thermal expansion coefficient as that of silicon and has excellent compatibility in a point of the thermal expansion coefficient in the relationship with the semiconductor chip to be connected.

A thickness of the substrate 11 is preferably, for example, 50 μm to 700 μm. Furthermore, the surface roughness (arithmetic average roughness Ra) of the first surface 11a of the substrate 11 is preferable to be small, to be 0.1 nm to 10 nm, from the viewpoint of preventing generation of the transmission loss to a high frequency signal in the first conductive layer 12 formed on the first surface 11a and the third conductive layer 21 formed on the second surface 11b of the substrate 11. In addition, the arithmetic average roughness Ra here conforms to a definition due to JIS B 0601: 2001.

As a material of the first conductive layer 12 and second conductive layer 14, materials having conductivity such as gold (Au), silver (Ag), copper (Cu), iron (Fe), nickel (Ni), platinum (Pt), palladium (Pd), ruthenium (Ru), and tungsten (W) may be used. Among these, Cu having high conductivity and low material cost is preferably used. Furthermore, a thickness of the first conductive layer 12 is preferably 0.5 μm to 20 μm, and a thickness of the second conductive layer 14 is preferably 0.5 μm to 5 μm. Regarding a wiring pattern, other than a subtractive formation due to the etching of a metal foil, an additive formation such as coating of a conductive paste, or formation due to the plating may be used. Here, as the metal foil, for example, Cu or the like may be used. Furthermore, as the conductive paste, a metal nano paste or the like may be used.

The ground layer 17 may include one or more layers. For example, the ground layer 17 may include at least one of an adhesion layer and a seed layer. In this example, an example where the ground layer 17 is formed of then adhesion layer and the seed layer will be described. In addition, the adhesion layer is a layer that makes it difficult to peel the first conductive layer 12 and the second conductive layer 14 from the substrate 11, or to peel the seed layer from the substrate 11. Furthermore, the seed layer is a layer for flowing a current when forming the first conductive layer 12 and the second conductive layer 14 by electrolytic plating to form a plating film. Therefore, if a function overlaps, the adhesion layer and the seed layer may be the same. The adhesion layer is an adhesion layer including, for example, zinc oxide (ZnO). The adhesion layer including zinc oxide may be formed by, for example, a sol-gel method. Furthermore, as the seed layer, Ti, Cr, or Cu may be used. The seed layer including Ti, Cr, Cu or the like may be formed by, for example, sputter. Furthermore, when the first conductive layer 12 and the through electrode 20 are simultaneously formed, it is preferable, from the viewpoint of the adhesiveness, to coat the ground layer 17 on an entire surface of the through hole 15 that has a depth in a thickness direction to a surface of the substrate 11. Accordingly, a thickness when the ground layer 17 is formed is preferably 20 nm to 300 nm on a surface of the substrate 11. Furthermore, the ground layer 17 may be used with a thickness as it is formed, however, as the result that the ground layer 17 is sufficiently coated on a surface of the through hole 15, there may be a case where the thickness of the ground layer 17 formed on the substrate 11 becomes excessive. As the result, there are cases where in the later process, due to a chemical or a plasma, selective damage tends to be received, or due to the fragility of the ground layer 17 itself, the conductive layer formed on the ground layer may be peeled. In order to prevent this, the thickness of the ground layer may be reduced by etching in advance after the formation of the ground layer. For example, on the substrate surface, the thickness of the ground layer may be reduced until a layer of about 1 to 10 nm is left.

As the first insulating layer 13, for example, an inorganic material may be used, and more specific examples thereof include silicon nitride ($Si_xN_y$), silicon dioxide ($SiO_2$), silicon oxynitride ($SiO_xN_y$), tantalum pentaoxide ($Ta_2O_5$), aluminum oxide ($Al_2O_3$), aluminum nitride (AlN), hafnium oxide ($HfO_2$), and aluminum added hafnium oxide. The first insulating layer 13 desirably has the specific permittivity higher than that of an insulating layer (for example, the resin layer 22) present in the surrounding of the capacitor 100. The specific permittivity of the first insulating layer 13 is in the range of, for example, 2.0 to 9.0, and more preferably 5.0 to 8.0. Among these, from the viewpoint of the specific permittivity and the insulation breaking voltage, silicon nitride ($Si_xN_y$) and silicon oxynitride ($SiO_xN_y$) may be preferably used. A thickness of the first insulating layer 13 (T1 described below) may be 50 nm to 800 nm.

In the embodiment of the present disclosure, as a film deposition process of the first conductive layer 12, second conductive layer 14 and first insulating layer 13, a chemical vapor deposition (CVD) process, a physical vapor deposition (PVD) process, or an electrolytic plating process may be used. As the chemical vapor deposition process, for example, a plasma CVD process and an atomic layer deposition (ALD) process may be used. As the physical vapor deposition process, for example, a sputtering process or a vapor deposition process may be used. Furthermore, a photolithography process may be used to form a pattern of the conductive layer and the insulating layer. Furthermore, as a process of flattening the conductive layer and the insulating layer, an etch back process and a chemical mechanical polishing (CMP) process may be used.

Next, a structure of the capacitor 100 of the present embodiment will be described. As shown in FIG. 1, the first insulating layer 13 is formed at a position where the second conductive layer 14 is arranged among an upper surface 12a of the first conductive layer 12. As shown in FIG. 3, the first insulating layer 13 has a first part 13a, a second part 13b and a third part 13c. The first part 13a is arranged between the first conductive layer 12 and the second conductive layer 14. The second part 13b extends continuously from the first part 13a to cover at least a part of a side surface 12b of the first conductive layer 12 and at least a part of a side surface 17a of the ground layer 17. The third part 13c extends continuously from the second part 13b to cover at least a part of the first surface 11a of the substrate 11. In the present embodiment, the first part 13a, the second part 13b, and the third part 13c are made of the same material.

In the present embodiment, the second part 13b of the first insulating layer 13 covers the side surface 12b of the first conductive layer 12 and the side surface 17a of the ground layer 17, furthermore, the third part 13c of the first insulating layer 13 covers a part of the first surface 11a of the substrate 11. For example, when the first insulating layer 13 is constituted of only the first part 13a, the short-circuiting tends to occur between the first conductive layer 12 and the second conductive layer 14 at positions shown with a circle of a dotted line in FIG. 3. Furthermore, when an end part of the first insulating layer 13 is located more inside than an end part of the second conductive layer 14, a region where the first insulating layer 13 is not present between the first conductive layer 12 and the second conductive layer 14 is generated. When a space is formed in the region, the first conductive layer 12 and the second conductive layer 14 come into contact due to the pressure or the like to be a factor of generating the short-circuiting. Furthermore, when the resin layer 22 flows into this space, the resin layer 22 having the specific permittivity lower than that of the first insulating layer 13 becomes a factor of lowering capacitance of the capacitor 100.

On the other hand, in the present embodiment, since the second part 13b of the first insulating layer 13 extends continuously from the first part 13a to cover the side surface 12b of the first conductive layer 12, the short-circuiting between the first conductive layer 12 and the second conductive layer 14 may be prevented. Furthermore, although there may be a case where a position of the second conductive layer 14 may be shifted in a horizontal direction of FIG. 3 depending on the accuracy of the patterning, the first insulating layer 13 covers the side surface 12b of the first conductive layer 12 and the side surface 17a of the ground layer 17 with the second part 13b, and the third part 13c covers up to the first surface 11a of the substrate 11. Accordingly, even when the position of the second conductive layer 14 is shifted, the first conductive layer 12 and the ground layer 17 may be prevented from short-circuiting with the second conductive layer 14. Furthermore, since the third part 13c of the first insulating layer 13 contacts with the first surface 11a of the substrate 11, the resistance to peeling of the first insulating layer 13 is improved.

In addition, in order to make the second part 13b of the first insulating layer 13 function effectively as an insulation film, a thickness T2 of the second part 13b of the first insulating layer 13 is preferable to be ¼ or larger the thickness T1 of the first part 13a of the first insulating layer 13. An upper limit of the thickness T2 of the second part 13b of the first insulating layer 13 is not particularly limited, but may be, for example, the thickness T1 or smaller of the first part 13a of the first insulating layer 13, or may be ½ or smaller the thickness T1. Furthermore, the thickness T2 of the second part 13b of the first insulating layer 13 is preferably 25 nm or larger. When considering the above content, the thickness T1 of the first part 13a of the first insulating layer 13 is preferably 50 nm to 400 nm, and the thickness T2 of the second part 13b of the first insulating layer 13 is preferably 25 nm to 200 nm. Furthermore, a length (a distance from the first conductive layer 12 to an end part of the third part 13c) L1 of the third part 13c of the first insulating layer 13 is preferably 10 μm to 200 μm, and a thickness T3 of the third part 13c of the first insulating layer 13 is preferably 50 nm to 200 nm.

Furthermore, the surface roughness (arithmetic average roughness Ra) of the upper surface 12a of the first conductive layer 12 is preferable to be smaller from the viewpoint of the yield of the capacitors 100, and preferable to be 0.5 nm to 100 nm. Still furthermore, if the side surface 12b of the first conductive layer 12 is a part that does not function as the capacitor 100, it may be a rough surface having a certain degree of roughness, for example, the surface roughness (arithmetic average roughness Ra) of the side surface 12b of the first conductive layer 12 may be 20 nm to 200 nm. Due to the surface roughness like this, the adhesiveness between the first conductive layer 12 (side surface 12b) and the first insulating layer 13 is improved.

Next, a method of manufacturing the interposer 10, in particular, an example of forming the capacitor 100 (first conductive layer 12, first insulating layer 13, and second conductive layer 14) will be described. FIG. 4A to FIG. 4F are diagrams for describing a method of manufacturing the interposer 10 according to the first embodiment of the present disclosure. In what follows, an example of forming the through electrode 20 electrically connected to the first conductive layer 12 and forming the third conductive layer 21 electrically connected to the first conductive layer 12 via the through electrode 20 simultaneously with the first conductive layer 12 will be described.

Figure 4A:
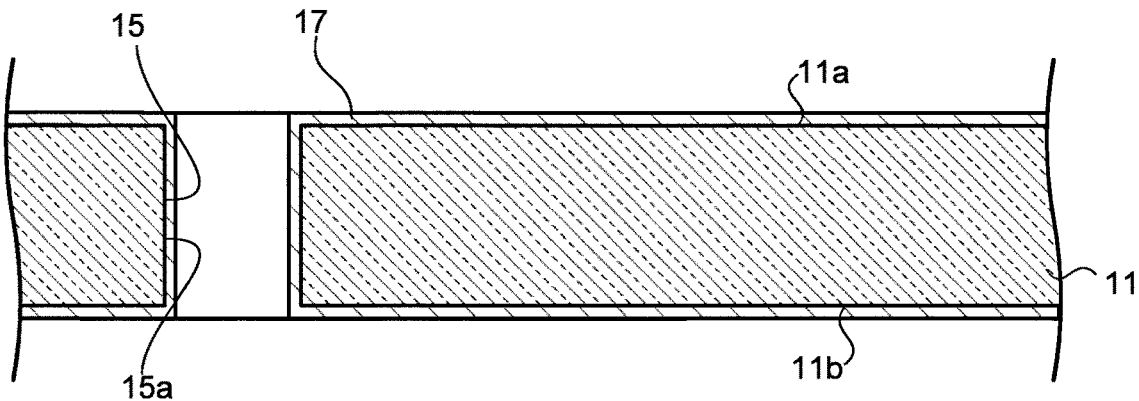
FIG. 4A is a diagram for explaining a method of manufacturing the interposer according to the first embodiment of the present disclosure.

The substrate 11 having the first surface 11a and second surface 11b, and the through hole 15 penetrating through the first surface 11a and the second surface 11b is prepared. Then, as shown in FIG. 4A, the ground layer 17 is formed on the first surface 11a, the second surface 11b, and, the side wall 15a of the through hole 15 of the substrate 11. In what follows, an example where the ground layer 17 is constituted of an adhesive layer and a seed layer will be described. First, the adhesive layer is formed by a physical deposition method such as a vapor deposition method or a sputtering method. Subsequently, with the same physical deposition method, the seed layer is formed on the adhesive layer. Thereafter, a process of annealing the adhesive layer and the seed layer may be applied.

In addition, a method of forming the adhesive layer and the seed layer is not limited to the above methods. For example, an adhesive layer including zinc oxide (ZnO) or the like may be formed, followed by forming a seed layer on the adhesive layer by an electrolytic plating method. The adhesive layer including zinc oxide may be formed by, for example, a sol-gel method. Furthermore, as was described above, both the adhesive layer and seed layer may be formed by the physical deposition method such as the vapor deposition method or the sputtering method, or the sol-gel method, an electroless plating method, and a physical deposition method may be combined.

Figure 4B:
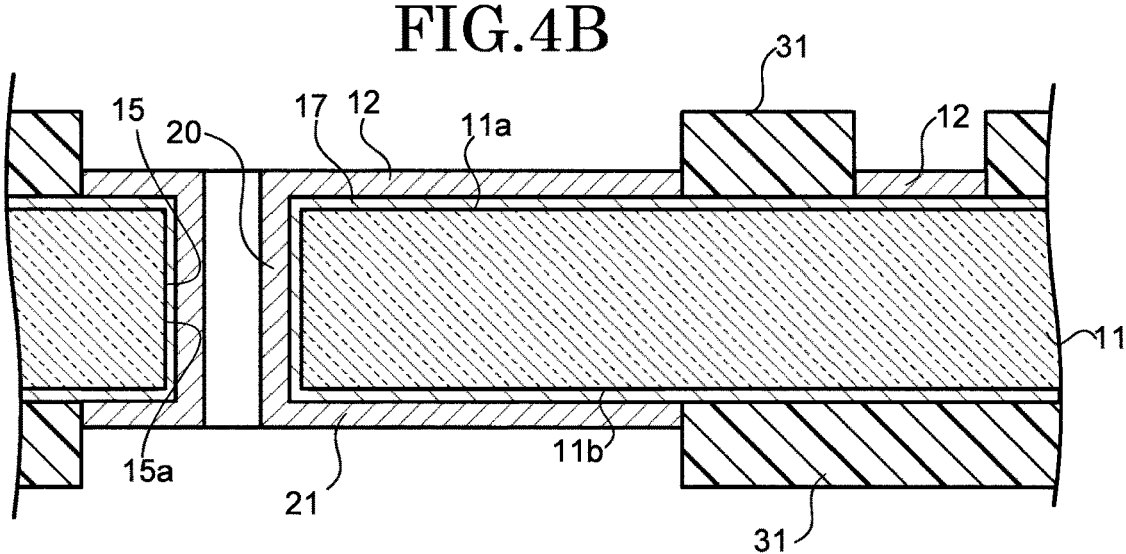
FIG. 4B is a diagram for explaining the method of manufacturing the interposer according to the first embodiment of the present disclosure.

Next, as shown in FIG. 4B, the first resist layer 31 is partially formed on the ground layer 17. Subsequently, by the electrolytic plating, a plating layer is formed on the ground layer 17 that is not covered by the first resist layer 31. By the plating layer, the first conductive layer 12 on the first surface 11a of the substrate 11, the through electrode 20 of the through hole 15, and the third conductive layer 21 on the second surface 11b of the substrate 11 may be formed. As was described above, the ground layer 17 is arranged in each of between the substrate 11 (first surface 11a) and the first conductive layer 12, between the substrate 11 (side wall 15a of the through hole 15) and the through electrode 20, and between the substrate 11 (second surface 11b) and the third conductive layer 21.

Figure 4C:
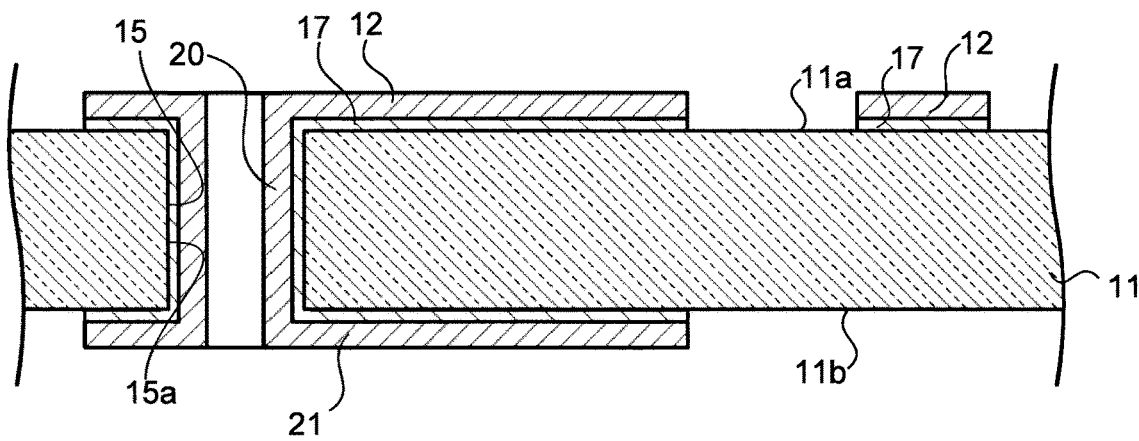
FIG. 4C is a diagram for explaining the method of manufacturing the interposer according to the first embodiment of the present disclosure.

Thereafter, as shown in FIG. 4C, the first resist layer 31 is removed. Furthermore, a part (a part where the first conductive layer 12 was not formed) covered by the first resist layer 31 of the ground layer 17 is removed by, for example, the wet etching. Thus, an inductor provided with the first conductive layer 12 on the first surface 11a of the substrate 11, the through electrode 20 of the through hole 15, and the third conductive layer 21 on the second surface 11b of the substrate 11 may be also formed. The inductor will be described in more detail in a twenty-fourth embodiment. In addition, a process of annealing the conductive layer may be applied. Furthermore, when a through electrode filled with a conductive material is formed, a conductive material may be filled in the through hole 15 by further applying an electroplating process.

Next, a surface treatment process where a surface of the first conductive layer 12 is exposed to plasma such as a $NH_3$ plasma may be performed. Thus, an oxide on the surface of the first conductive layer 12 may be removed. Thus, the adhesiveness between the first conductive layer 12 and the first insulating layer 13 may be improved.

Next, the first insulating layer 13 is formed. First, a resist layer (omitted from showing in the drawing) is partially formed on the first conductive layer 12 and the first surface 11a of the substrate 11. Subsequently, the first insulating layer 13 is formed on a part that is not covered with the resist layer and a part that is covered with the resist layer of the first conductive layer 12 and the first surface 11a of the substrate 11. At this time, the first insulating layer 13 is formed so as to cover the upper surface 12a of the first conductive layer 12, the side surface 12b of the first conductive layer 12, the side surface 17a of the ground layer 17, and the first surface 11a of the substrate 11. Thus, the first insulating layer 13 having the first part 13a, the second part 13b, and the third part 13c is formed.

Figure 4D:
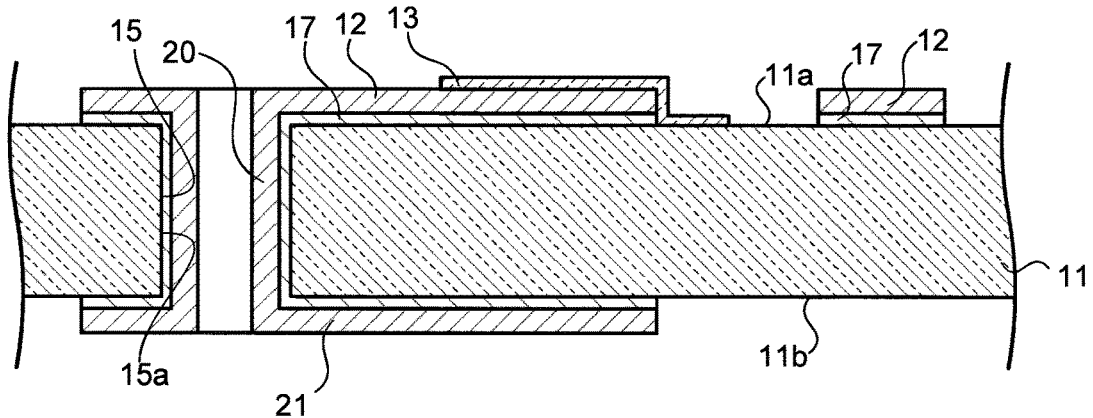
FIG. 4D is a diagram for explaining the method of manufacturing the interposer according to the first embodiment of the present disclosure.

As a method of forming the first insulating layer 13, for example, a plasma CVD method or a sputtering method may be used. In addition, since the sputtering method has large direction dependency, and there is a case where it is difficult to form the first insulating layer 13 on the side surface 12b of the first conductive layer 12, it is preferable to adopt the plasma CVD method. After the first insulating layer 13 is formed, the resist layer is removed by, for example, wet etching. At this time, the first insulating layer 13 formed on the resist layer is removed by the lift-off. FIG. 4D shows a state after the resist layer was removed. In addition, before forming the resist layer, the first insulating layer 13 is formed, the resist layer is formed only on a part where the insulating layer 13 is left, and the first insulating layer 13 may be etched. That is, the first insulating layer 13 may be formed by the photolithography as shown in FIG. 4D.

Figure 4E:
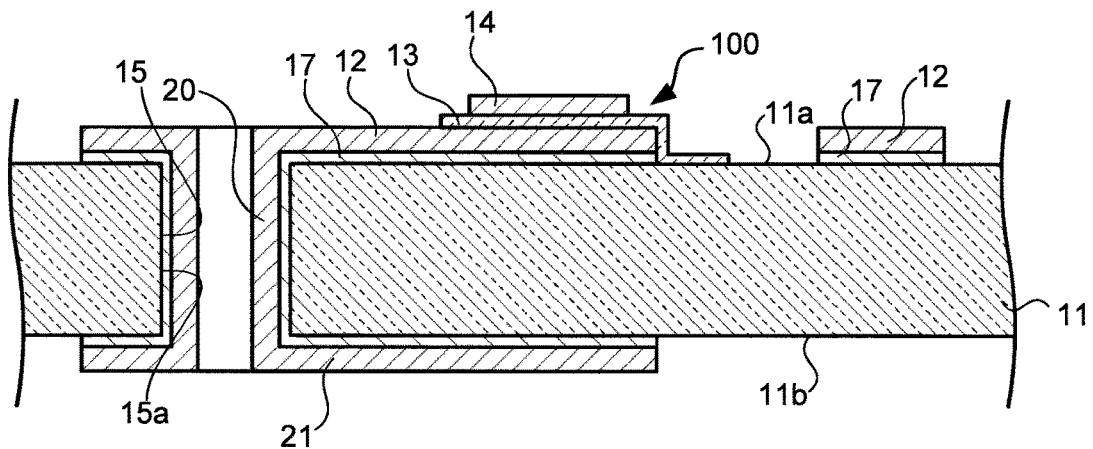
FIG. 4E is a diagram for explaining the method of manufacturing the interposer according to the first embodiment of the present disclosure.

Next, as shown in FIG. 4E, the second conductive layer 14 is formed on the first insulating layer 13. Thus, a capacitor provided with the first conductive layer 12, the first insulating layer 13 on the first conductive layer 12, and the second conductive layer 14 on the first insulating layer 13 may be constituted. Since a process of forming the second conductive layer 14 is the same as a process of forming the first conductive layer 12, for example, the plating layer, description thereof will be omitted. Here, in the case where the second conductive layer 14 is formed of the plating layer, a seed layer or the like may be formed between the second conductive layer 14 and the insulating layer 13. In addition, the second conductive layer 14 may be formed by etching a metal foil as was described above, or may be formed by coating a conductive paste.

After this, a resin layer 22 is formed, a via hole 23 is formed, the connection part 24 is formed, and a constitution shown in FIG. 2 is realized. In addition, a thickness of the resin layer 22 (a distance from the first surface 11a of the substrate 11 to a surface of the resin layer 22 in an example of FIG. 2) is desirable to be a total thickness or larger of the ground layer 17, the first conductive layer 12, the first insulating layer 13 and the second conductive layer 14, that is, in the range of two times or smaller the thickness to flatten the irregularity of the capacitor 100 or the like on the surface. Furthermore, in the neighborhood of the capacitor 100, capacitance is generated between the first conductive layer 12 and the connection part 24, but it is desired to make it as small as possible from the design point of view. Therefore, it is desirable to form the resin layer 22 having the specific permittivity lower than that of the first insulating layer 13 thicker between the first conductive layer 12 and the connection part 24. When the thickness of the resin layer 22 is set to a distance from the surface of the first insulating layer 13 to the surface of the resin layer 22, it is desirable to be 10 times or larger, for example, the thickness of the first insulating layer 13.

Figure 4F:
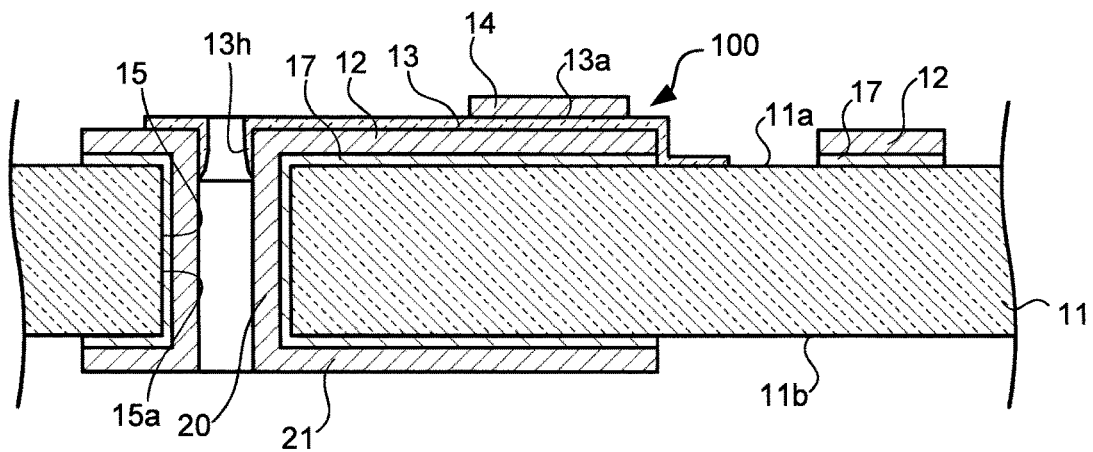
FIG. 4F is a diagram for explaining another example of the method of manufacturing the interposer according to the first embodiment of the present disclosure.

FIG. 4F is a diagram showing another example of the method of manufacturing the interposer 10 according to the first embodiment of the present disclosure. In FIG. 4E, an example where the first insulating layer 13 is not formed in the surrounding of the through hole 15 is shown. However, the first insulating layer 13 may be formed so as to extend up to the through electrode 20 arranged in the through hole 15. As shown in FIG. 4F, the first insulating layer 13 may be formed so as to extend from the first surface 11a side of the substrate 11 to cover at least a part of the through electrode 20. In the example of FIG. 4F, the first insulating layer 13 has a part 13h that extends continuously from the first part 13a to cover at least a part of the through electrode 20. According to the constitution, for example, when the seed layer is removed by etching after the first insulating layer 13 was formed, a part of the through electrode 20, and a conductive layer (a part of a boundary with the first conductive layer 12 and the through electrode 20) at a corner part of the through hole 15 are protected by the first insulating layer 13, thus, an influence due to the thinning of the through electrode 20 and the conductive layer in the surrounding thereof by the etching may be prevented. In addition, the seed layer that is removed by the etching after forming the first insulating layer 13 is, for example, a seed layer used when the second conductive layer 14 was formed with the plating layer.

Second Embodiment

Figure 5:
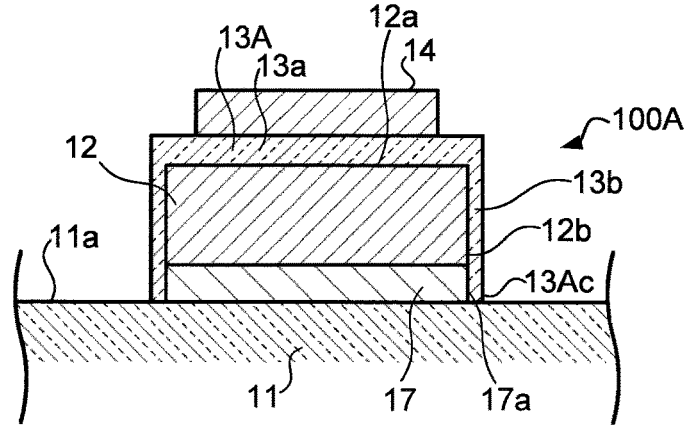
FIG. 5 is a schematic cross-sectional view showing a capacitor according to a second embodiment of the present disclosure.

FIG. 5 is a schematic cross-sectional view showing a capacitor 100A according to a second embodiment of the present disclosure. In the present embodiment, a third part 13Ac of a first insulating layer 13A does not extend so as to expand on a first surface 11a of a substrate 11 to cover a side surface 17a of the ground layer 17. According to the constitution, the second part 13b of the first insulating layer 13A covers a side surface 12b of the first conductive layer 12 and a side surface 17a of the ground layer 17, and, extends from the second part 13b up to the third part 13Ac of the first insulating layer 13A until contacting with the substrate 11. Therefore, the first conductive layer 12 and the ground layer 17 may be prevented from causing short-circuiting with the second conductive layer 14.

Third Embodiment

Figure 6:
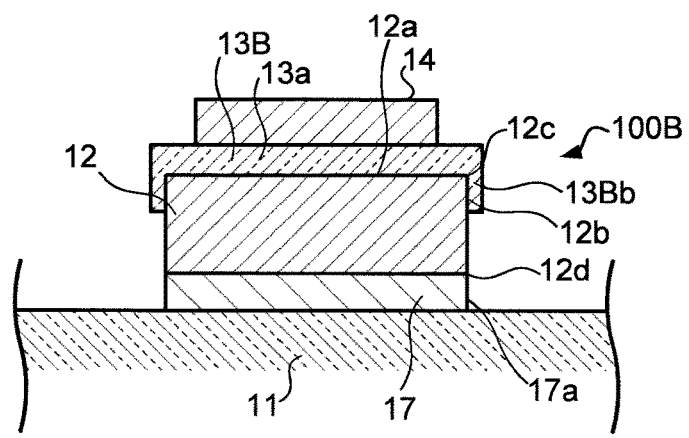
FIG. 6 is a schematic cross-sectional view showing a capacitor according to a third embodiment of the present disclosure.

FIG. 6 is a schematic cross-sectional view showing a capacitor 100B according to a third embodiment of the present disclosure. In the present embodiment, a second part 13Bb of a first insulating layer 13B extends from a first part 13a to a position between an upper end 12c and a lower end 12d of a side surface 12b of the first conductive layer 12. Thus, the second part 13Bb of the first insulating layer 13B does not necessarily cover an entire surface of the side surface 12b of the first conductive layer 12 and may be a constitution that covers at least a part of the side surface 12b of the first conductive layer 12. According to the constitution, the second part 13Bb of the first insulating layer 13B extends continuously from the first part 13a to cover a part of the side surface 12b of the first conductive layer 12. Accordingly, the first conductive layer 12 may be prevented from causing the short-circuiting with the second conductive layer 14.

In addition, the first insulating layer 13B shown in FIG. 6 may be formed by, for example, the lift-off that uses a resist layer. For example, the resist layer thinner than the first conductive layer 12 is formed on a part other than the first conductive layer 12, and the first insulating layer 13B is formed on the first conductive layer 12 and the resist layer. Thereafter, when the resist layer is removed, the second part 13Bb of the first insulating layer 13B covering a part of the side surface 12b is formed.

Fourth Embodiment

Figure 7:
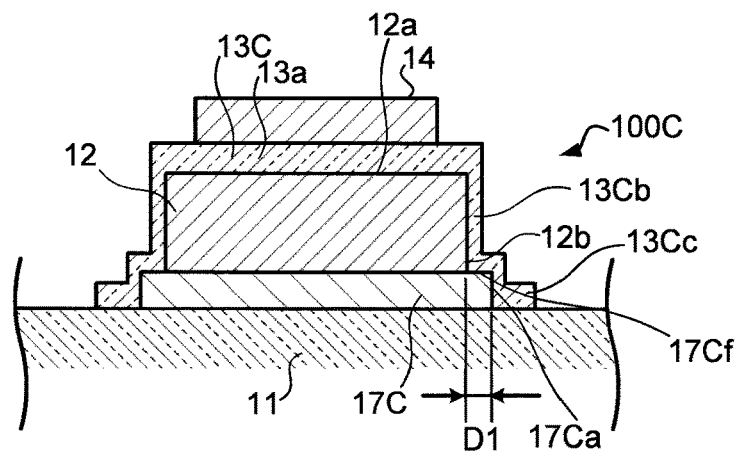
FIG. 7 is a schematic cross-sectional view showing a capacitor according to a fourth embodiment of the present disclosure.

FIG. 7 is a schematic cross-sectional view showing a capacitor 100C according to a fourth embodiment of the present disclosure. In the present embodiment, a plane size of a ground layer 17C is larger than a plane size of the first conductive layer 12. That is, the ground layer 17C expands by a distance D1 more outside than the side surface 12b of the first conductive layer 12, and a side surface 17Ca of the ground layer 17C is present outside than the side surface 12b of the first conductive layer 12. That is, an upper surface 17Cf that is not covered by the first conductive layer 12 appears in the end part of the ground layer 17C. A second part 13Cb of a first insulating layer 13C covers the side surface 12b of the first conductive layer 12, an upper surface 17Cf and a side surface 17Ca of a part (end part) of the ground layer 17, and, extends from the second part 12Cb to a third part 13Cc of the first insulating layer 13C until contacting with the substrate 11. Accordingly, the first conductive layer 12 and the ground layer 17C are prevented from causing the short-circuiting with the second conductive layer 14. In addition, the distance D1 is preferable to be 20 nm to 1000 nm.

Fifth Embodiment

Figure 8:
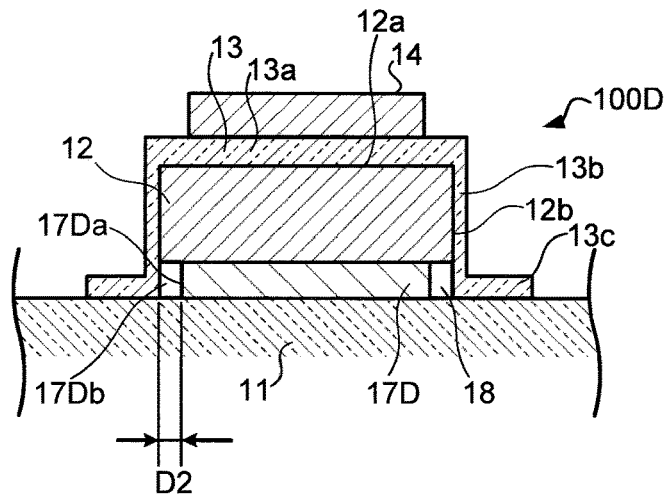
FIG. 8 is a schematic cross-sectional view showing a capacitor according to a fifth embodiment of the present disclosure.

FIG. 8 is a schematic cross-sectional view showing a capacitor 100D according to a fifth embodiment of the present disclosure. In the present embodiment, a plane size of a ground layer 17D is smaller than a plane size of the first conductive layer 12. That is, the ground layer 17D has a side surface 17Da protruded inward by a distance D2 than the side surface 12b of the first conductive layer 12. Thus, a recess part 17Db is formed by the first conductive layer 12, the substrate 11 and the ground layer 17D. Due to the recess part 17Db and the first insulating layer 13, a space 18 is formed in the lower side of the first conductive layer 12. The second part 13b and the third part 13c of the first insulating layer 13 are arranged so as to leave at least a part of the space 18. Even in a state where at least a part of the space 18 is left as a gap like this, due to an insulation effect of the third part 13c of the first insulating layer 13, the first conductive layer 12 and the ground layer 17 are prevented from causing the short-circuiting with the second conductive layer 14.

Sixth Embodiment

Figure 9:
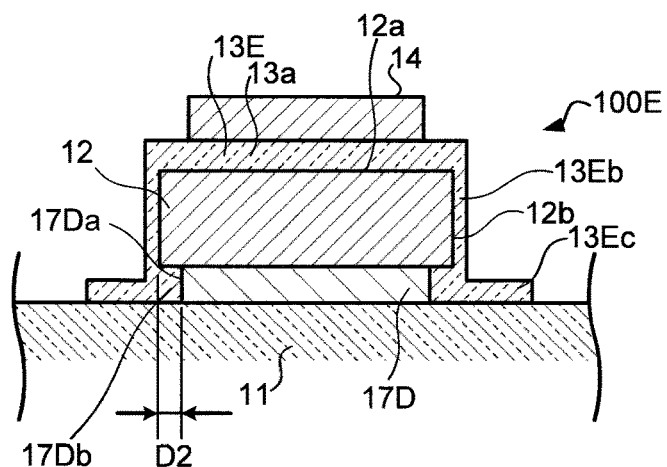
FIG. 9 is a schematic cross-sectional view showing a capacitor according to a sixth embodiment of the present disclosure.

FIG. 9 is a schematic cross-sectional view showing a capacitor 100E according to a sixth embodiment of the present disclosure. In the present embodiment, a second part 13Eb and third part 13Ec of a first insulating layer 13E are arranged so as to fill a recess part 17Db (see FIG. 8). According to this constitution, a second part 13Eb and a third part 13Ec of the first insulating layer 13E fill the recess part 17Db on a lower side of the first conductive layer 12. Accordingly, compared with the constitution of FIG. 8, the first conductive layer 12 and the ground layer 17D are more effectively prevented from causing the short-circuiting with the second conductive layer 14. Furthermore, since the first insulating layer 13E flows into the recess part 17Db, the adhesiveness between the first conductive layer 12 and the ground layer 17D is also improved. From the viewpoint of prevention of the short-circuiting and improvement of the adhesiveness, a size of the recess part 17Db of the ground layer 17D, that is, a distance D2 from the first insulating layer 13 to the side surface 17Da of the ground layer 17 is preferable to be 20 nm to 1000 nm.

Seventh Embodiment

Figure 10:
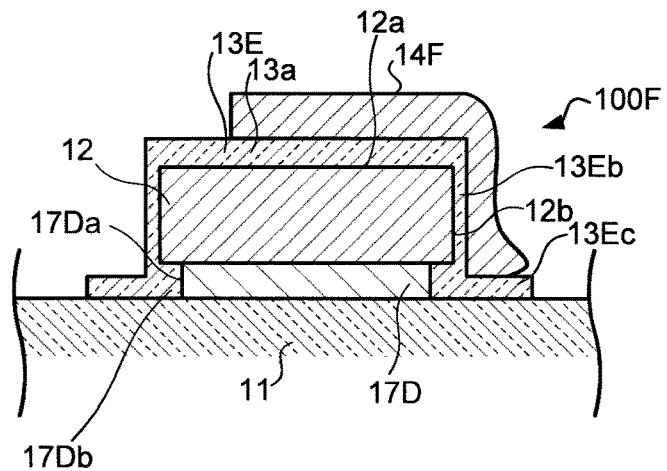
FIG. 10 is a schematic cross-sectional view showing a capacitor according to a seventh embodiment of the present disclosure.

FIG. 10 is a schematic cross-sectional view showing a capacitor 100F according to a seventh embodiment of the present disclosure. In the present embodiment, in the constitution of FIG. 9, a second conductive layer 14F is arranged over a first part 13a, a second part 13Eb and a third part 13Ec of a first insulating layer 13E. According to the constitution, since an adhesion area of the second conductive layer 14F and the first insulating layer 13E is large, the adhesiveness is improved. Furthermore, according to the constitution, although distances between the second conductive layer 14F and the first conductive layer 12 and the ground layer 17D become nearer, since the second part 13Eb and third part 13Ec of the first insulating layer 13E fill a recess part 17Db on the lower side of the first conductive layer 12, the first conductive layer 12 and the ground layer 17D may be prevented from short-circuiting with the second conductive layer 14F.

Eighth Embodiment

Figure 11:
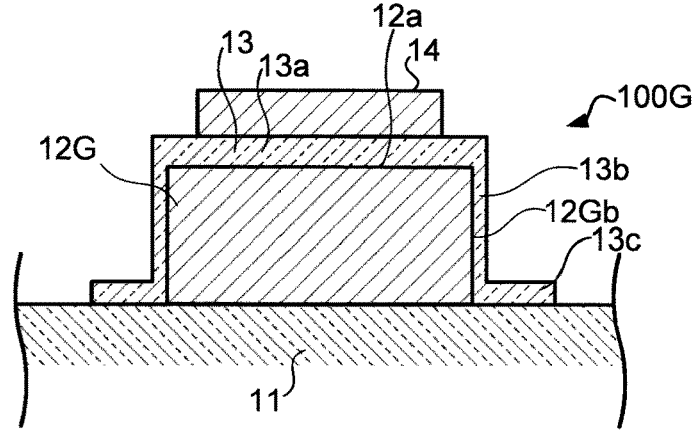
FIG. 11 is a schematic cross-sectional view showing a capacitor according to an eighth embodiment of the present disclosure.

FIG. 11 is a schematic cross-sectional view showing a capacitor 100G according to an eighth embodiment of the present disclosure. The present embodiment corresponds to a case where a first conductive layer 12G is formed without the ground layer 17 in the capacitor 100 of the first embodiment shown in FIG. 3. According to the constitution, the first insulating layer 13 covers a side surface 12Gb of the first conductive layer 12G with a second part 13b and covers up to the first surface 11a of the substrate 11 with a third part 13c. Accordingly, even when a position of the second conductive layer 14 is displaced, the first conductive layer 12G may be prevented from short-circuiting with the second conductive layer 14. Furthermore, since the third part 13c of the first insulating layer 13 contacts the first surface 11a of the substrate 11, the resistance against peeling of the first insulating layer 13 is improved.

Ninth Embodiment

Figure 12:
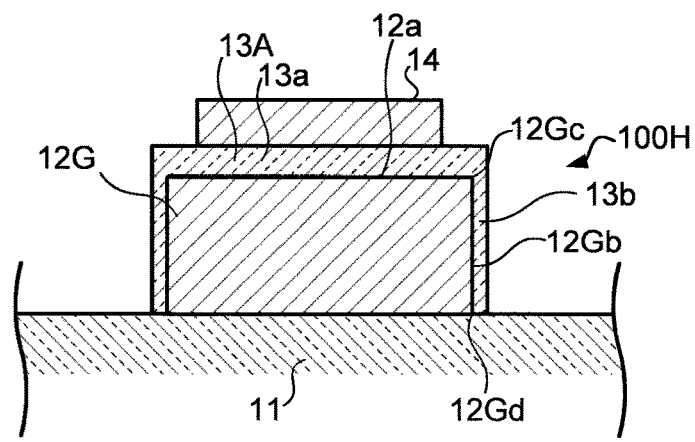
FIG. 12 is a schematic cross-sectional view showing a capacitor according to a ninth embodiment of the present disclosure.

FIG. 12 is a schematic cross-sectional view showing a capacitor 100H according to a ninth embodiment of the present disclosure. The present embodiment corresponds to a case where the first conductive layer 12G is formed without the ground layer 17 in the capacitor 100A of the second embodiment shown in FIG. 5. That is, the second part 13b of the first insulating layer 13A covers an entirety between an upper end 12Gc and a lower end 12Gd of the side surface 12Gb of the first conductive layer 12G. According to the constitution, the second part 13b of the first insulating layer 13A extends continuously from the first part 13a to cover entirely the side surface 12Gb of the first conductive layer 12G. Accordingly, the first conductive layer 12G may be prevented from short-circuiting with the second conductive layer 14.

Tenth Embodiment

Figure 13:
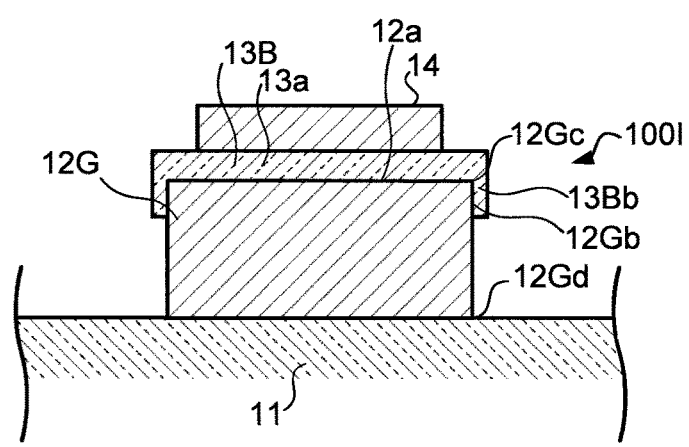
FIG. 13 is a schematic cross-sectional view showing a capacitor according to a tenth embodiment of the present disclosure.

FIG. 13 is a schematic cross-sectional view showing a capacitor 100I according to a tenth embodiment of the present disclosure. The present embodiment corresponds to a case where the first conductive layer 12G is formed without the ground layer 17 in the capacitor 100B of the third embodiment shown in FIG. 6. That is, the second part 13Bb of the first insulating layer 13B covers up to a position between the upper end 12Gc and the lower end 12Gd of the side surface 12Gb of the first conductive layer 12G. According to the constitution, the second part 13Bb of the first insulating layer 13B extends continuously from the first part 13a to cover a part of the side surface 12Gb of the first conductive layer 12G. Accordingly, the first conductive layer 12G may be prevented from short-circuiting with the second conductive layer 14.

Eleventh Embodiment

Figure 14:
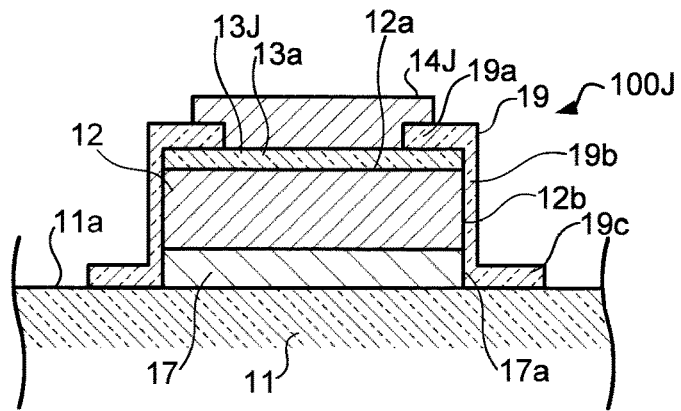
FIG. 14 is a schematic cross-sectional view showing a capacitor according to an eleventh embodiment of the present disclosure.

FIG. 14 is a schematic cross-sectional view showing a capacitor 100J according to an eleventh embodiment of the present disclosure. Like the capacitor 100J, an insulating layer that covers the side surface 12b of the first conductive layer 12 and the side surface 17a of the ground layer 17 may be formed of a second insulating layer 19 of a material different from the first insulating layer 13. In the present embodiment, a first insulating layer 13J is constituted of the first part 13a arranged between the first conductive layer 12 and the second conductive layer 14. That is, the first insulating layer 13J is arranged only on the upper surface 12a of the first conductive layer 12. The second insulating layer 19 has a first part 19a, a second part 19b and a third part 19c. The first part 19a is arranged on the first insulating layer 13J. The second part 19b extends continuously from the first part 19a to cover the side surface 12b of the first conductive layer 12 and the side surface 17a of the ground layer 17. The third part 19c extends continuously from the second part 19b to cover at least a part of the first surface of the substrate 11.

As the second insulating layer 19, an organic material or an inorganic material may be used. When the recess part 17Db is present like the sixth embodiment shown in FIG. 9, by constituting the second insulating layer 19 of a resin, by utilizing deformation of the resin, the recess part 17Db below the first conductive layer 12 may be filled. Furthermore preferably, the second insulating layer 19 is a photosensitive resin that may be patterned by light, for example, a photosensitive polyimide. Furthermore, the second insulating layer 19 may be a resin in which an aperture may be formed by laser, for example, an epoxy resin. According to the constitution, since the second insulating layer 19 covers the side surface 12b of the first conductive layer 12, the side surface 17a of the ground layer 17 and the first surface 11a of the substrate 11, the first conductive layer 12 and the ground layer 17 may be prevented from causing short-circuit with the second conductive layer 14. In addition, in the present embodiment, with a thickness of the second part 19b of the second insulating layer 19 as T2, and a thickness of the third part 19c as T3, the content of the embodiment relating to the thickness may be applied.

Figure 15A:
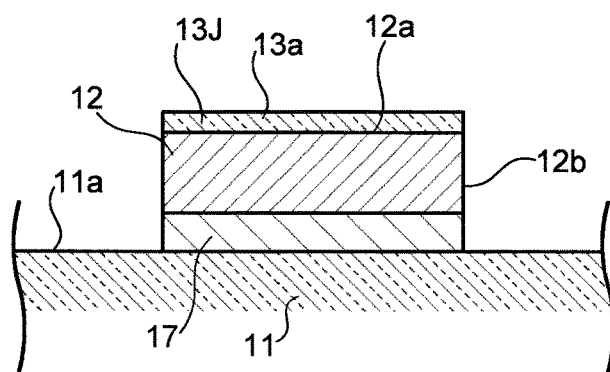
FIG. 15A is a diagram for explaining a method of manufacturing the capacitor according to the eleventh embodiment of the present disclosure.
Figure 15B:
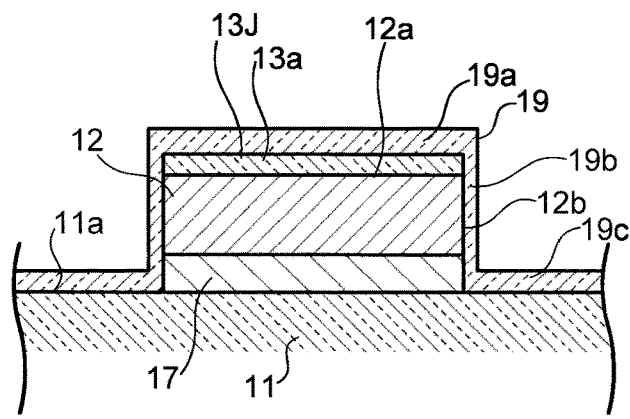
FIG. 15B is a diagram for explaining the method of manufacturing the capacitor according to the eleventh embodiment of the present disclosure.
Figure 15C:
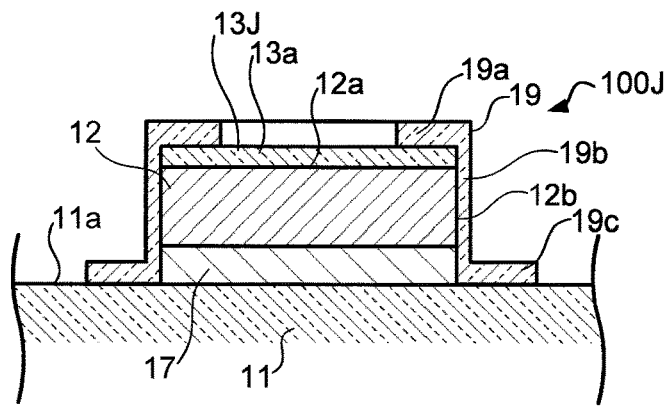
FIG. 15C is a diagram for explaining the method of manufacturing the capacitor according to the eleventh embodiment of the present disclosure.

FIG. 15A to FIG. 15C are diagrams for describing a method of manufacturing a capacitor according to the eleventh embodiment of the present disclosure. The method may be realized corresponding to a process of FIG. 4D in the first embodiment. First, as shown in FIG. 15A, the first insulating layer 13J is formed on the upper surface 12a of the first conductive layer 12. Next, as shown in FIG. 15B, a dry film-like photosensitive resin is formed so as to cover above the first insulating layer 13J, the side surface 12b of the first conductive layer 12, and a part of the first surface 11a of the substrate 11 by a vacuum lamination molding. Here, as the photosensitive resin, for example, a photosensitive polyimide may be used. Thus, the second insulating layer 19 having the first part 19a arranged on the first insulating layer 13, the second part 19b covering the side surface 12b of the first conductive layer 12, and the third part 19c covering at least a part of the first surface 11a of the substrate 11 is formed. Thereafter, a laminated photosensitive resin is placed under atmospheric pressure. Thus, in the fifth embodiment where the space 18 is formed like FIG. 8, the inner pressure of the space 18 is a pressure when the lamination molding is applied. Therefore, by placing under atmospheric pressure, the space 18 is collapsed by an influence of pressure difference, as the result, like the sixth embodiment shown in FIG. 9, the photosensitive resin flows into the recess part 17Db in the lower side of the first conductive layer 12. Next, as shown in FIG. 15C, by the photolithography, a part of the first part 19a and a part of the third part 19c of the second insulating layer 19 are removed. The part of the first part 19a is a part where the second conductive layer 14 is formed on the first insulating layer 13J. By removing this part, the first part 13a of the first insulating layer 13J is exposed. The part of the third part 19c is a part that is separated more than a predetermined distance from the second part 19b. Furthermore, after the dry film-like non-photosensitive resin is formed so as to cover above the first insulating layer 13, the side surface 12b of the first conductive layer 12, and a part of the first surface 11a of the substrate 11 by the vacuum lamination molding, by irradiating a UV laser, a carbon dioxide laser, or an excimer laser, a part of the first part 19a and a part of the third part 19c of the second insulating layer 19 may be removed. As the dry film-like non-photosensitive resin, for example, an epoxy resin may be used. Next, as shown in FIG. 14, on a part where the first insulating layer 13J is exposed of a part from which the second insulating layer 19 is removed, the second conductive layer 14 is formed. At this time, also on a part on the second insulating layer 19, the second conductive layer 14 is formed.

A method shown in FIG. 15A to FIG. 15C is advantageous in a case of a constitution where an insulating layer is arranged on the recess part 17Db formed on the lower side of the first conductive layer 12 like in the sixth embodiment shown in the above FIG. 9. Since a photosensitive or non-photosensitive resin is laminated under a first pressure, followed by placing under a second pressure higher than the first pressure during the lamination, the photosensitive or non-photosensitive resin tends to flow into the recess part 17Db on the lower side of the first conductive layer 12, resultantly, the recess part 17Db is readily filled with the resin. In addition, in the above-described example, the first pressure is vacuum and the second pressure is atmospheric pressure, but they are not limited to these. That is, it is preferably that the second pressure is higher than the first pressure. Furthermore, as long as in the constitution where the recess part 17Db is not present, or in the constitution where the space 18 may remain in the recess part 17Db, the second pressure may be lower than the first pressure, or may be the same as the first pressure.

Twelfth Embodiment

Figure 16:
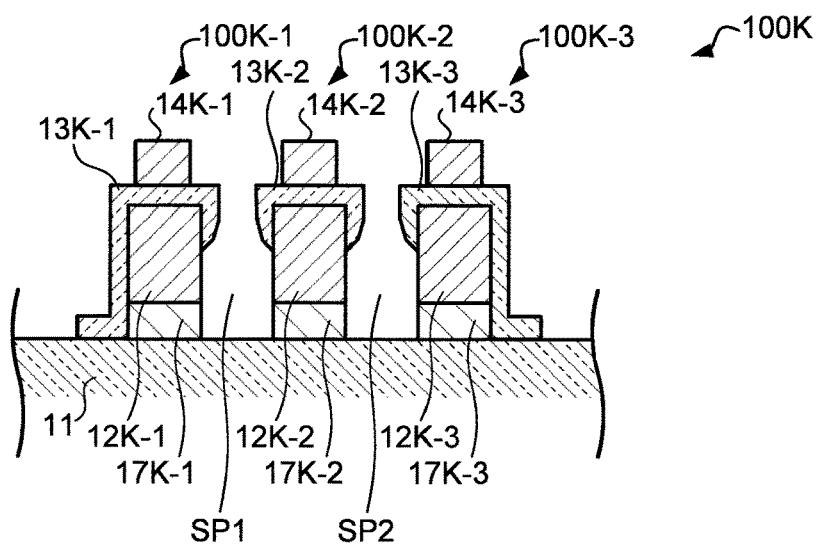
FIG. 16 is a schematic cross-sectional view showing a capacitor according to a twelfth embodiment of the present disclosure.

FIG. 16 is a schematic cross-sectional view showing a capacitor 100K according to a twelfth embodiment of the present disclosure. The capacitor may be divided into a plurality of areas as the capacitor 100K. For example, in FIG. 16, capacitors 100K-1, 100K-2 and 100K-3 are arranged on the substrate 11. In FIG. 16, although a case where the plurality of areas is 3 is shown, the plurality of areas is not limited to 3. Between the capacitor 100K-1 and the capacitor 100K-2, a space SP1 is arranged. Between the capacitor 100K-2 and the capacitor 100K-3, a space SP2 is arranged. That is, the capacitor 100K-2 is arranged between the capacitor 100K-1 and the capacitor 100K-3.

The capacitor 100K-1 includes a ground layer 17K-1, a first conductive layer 12K-1, a first insulating layer 13K-1 and a second conductive layer 14K-1. The capacitor 100K-2 includes a ground layer 17K-2, a first conductive layer 12K-2, a first insulating layer 13K-2 and a second conductive layer 14K-2. The capacitor 100K-3 includes a ground layer 17K-3, a first conductive layer 12K-3, a first insulating layer 13K-3 and a second conductive layer 14K-3. In addition, the ground layers 17K-1, 17K-2 and 17K-3 may not be formed.

In the case where a gap SP1 between the first conductive layer 12K-1 and the first conductive layer 12K-2 is narrow, that is, in the case where the first conductive layer 12K-1 and the first conductive layer 12K-2 are near, it is difficult to deposit the insulating layer in an area facing the gap SP1. As a result, on a part of a side surface facing the gap SP1 of the side surfaces of the first conductive layer 12K-1 and the first conductive layer 12K-2, the first insulating layers 13K-1 and 13K-2 are not formed. Similarly, on a part of a side surface facing the gap SP2 of the side surfaces of the first conductive layer 12K-2 and the first conductive layer 12K-3, the first insulating layers 13K-2 and 13K-3 are not formed. Even in the constitution like this, the second conductive layer is difficult to be formed in the gaps SP1 and SP2, and the first conductive layers 12K-1, 12K-2, 12K-3 and the ground layers 17K-1, 17K-2 and 17K-3 may prevent to cause the short-circuiting with the second conductive layers 14K-1, 14K-2 and 14K-3.

Thirteenth Embodiment

Figure 17:
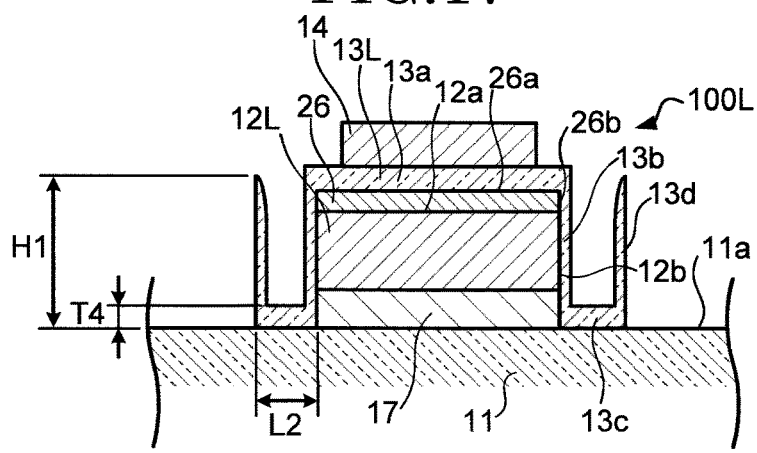
FIG. 17 is a schematic cross-sectional view showing a capacitor according to a thirteenth embodiment of the present disclosure.

FIG. 17 is a schematic cross-sectional view showing a capacitor 100L according to a thirteenth embodiment of the present disclosure. The capacitor 100L of the present embodiment further includes an intermediate layer 26 between a first conductive layer 12L and a first insulating layer 13L. The intermediate layer 26 is preferably a conductive material for enhancing the adhesiveness between the first conductive layer 12L and the first insulating layer 13L, for example, titanium (Ti), titanium nitride (TiN), nickel (Ni) and a nickel-gold alloy (Ni—Au) may be used. A thickness of the intermediate layer 26 is preferably 20 nm to 200 nm. In addition, the intermediate layer 26 may be omitted. By adopting the conductive material for enhancing the adhesiveness as the intermediate layer 26, when removing a second resist layer 32 (see FIG. 18E) by the lift-off described below, the first insulating layer 13L becomes difficult to be peeled.

In the present embodiment, a first part 13a of the first insulating layer 13L is arranged between the intermediate layer 26 and the first conductive layer 12L. The first part 13a of the first insulating layer 13L covers an upper surface 26a of the intermediate layer 26, furthermore, the second part 13b of the first insulating layer 13L covers the side surface 26b of the intermediate layer 26 and the side surface 12b of the first conductive layer 12L, furthermore, the third part 13c of the first insulating layer 13L covers the first surface 11a of the substrate 11. In the present embodiment, a thickness T4 of the third part 13c is preferably 50 nm to 200 nm.

Furthermore, the first insulating layer 13L is connected with the third part 13c, and has a fourth part 13d extending in the direction intersecting with the first surface 11a of the substrate 11. In other words, the fourth part 13d may be said to extend outwardly relative to the substrate 11. In an example of FIG. 17, the fourth part 13d is formed so as to extend continuously from the third part 13c and so as to rise up from the first surface 11a of the substrate 11. The fourth part 13d has a tapered shape (tapering shape) such that a width of its tip end becomes smaller than a width of its bottom part. In addition, a height H1 of the fourth part 13d is preferably 25 μm or larger. The present embodiment has the following advantages. For example, in a structure like the second conductive layer 14F of the seventh embodiment shown in FIG. 10, since a shape in which the second conductive layer 14F is dammed by the fourth part 13d is formed, the insulation property to an adjacent MIM structure, for example, a capacitor may be more improved.

Furthermore, in the present embodiment, a length (a distance from the first conductive layer 12L to an end part of the third part 13c) L2 of the third part 13c is preferably 20 μm or larger. By setting the length L2 of the third part 13c in the above range, when the second resist layer 32 (see FIG. 18E) is removed by the lift-off described below, the first insulating layer 13 becomes difficult to be peeled.

Figure 18A:
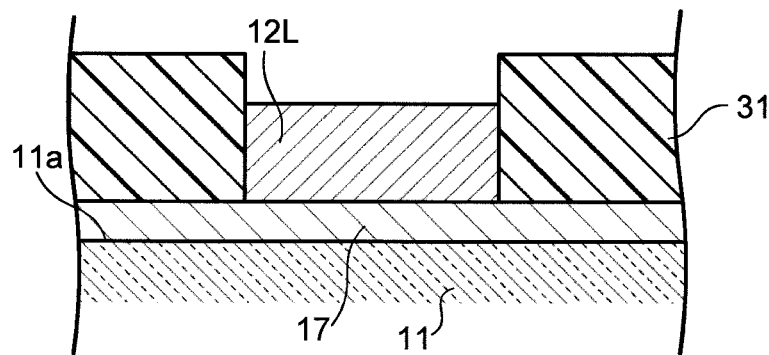
FIG. 18A is a diagram for explaining a method of manufacturing the capacitor according to the thirteenth embodiment of the present disclosure.

FIG. 18A to FIG. 18F are diagrams for describing a method of manufacturing a capacitor 100L according to a thirteenth embodiment of the present disclosure. In FIG. 18A to FIG. 18F, processes after the first conductive layer 12L was formed on the first surface 11a of the substrate 11 are shown. FIG. 18A is an enlarged diagram of a first surface 11a side of a state of FIG. 4B.

Figure 18B:
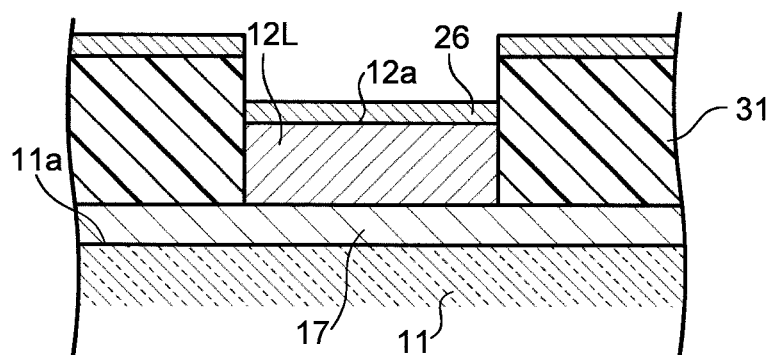
FIG. 18B is a diagram for explaining the method of manufacturing the capacitor according to the thirteenth embodiment of the present disclosure.
Figure 18C:
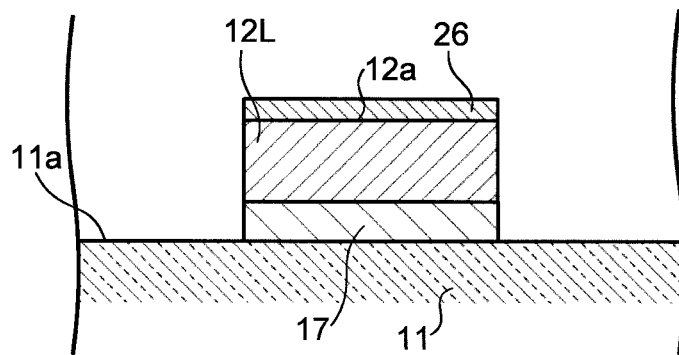
FIG. 18C is a diagram for explaining the method of manufacturing the capacitor according to the thirteenth embodiment of the present disclosure.

As shown in FIG. 18A, the first conductive layer 12L is formed on the first surface 11a of the substrate 11. Next, as shown in FIG. 18B, a layer of a conductive material such as titanium (corresponding to the intermediate layer 26) is formed by the physical vapor deposition (PVD) so as to cover the upper surface 12a of the first conductive layer 12L and the upper surface 31a of the first resist layer 31. Here, as the physical vapor deposition, for example, a sputtering method or a vapor deposition method may be used. Next, as shown in FIG. 18C, the first resist layer 31 is removed by the lift-off. The lift-off is a method of peeling the resist and leaving only a target pattern. During this lift-off, a layer of a conductive material formed on the upper surface of the first resist layer 31 is removed together with the first resist layer 31. Thus, a state where the intermediate layer 26 is formed on the upper surface 12a of the first conductive layer 12L is formed. Then, a part that was covered by the first resist layer 31 of the ground layer 17 (a part on which the first conductive layer 12L is not formed) is removed, for example, by wet etching. In addition, after removing the first resist layer 31, a treatment of removing a resist residue due to a dry surface treatment may be performed. Thus, the adhesiveness of the first insulating layer 13L to be generated in the next process may be improved.

Figure 18D:
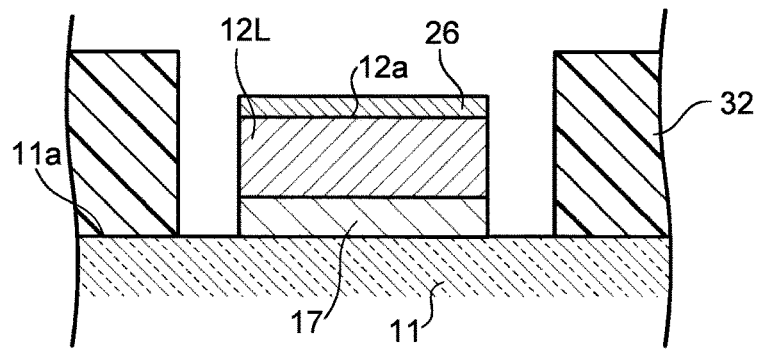
FIG. 18D is a diagram for explaining the method of manufacturing the capacitor according to the thirteenth embodiment of the present disclosure.
Figure 18E:
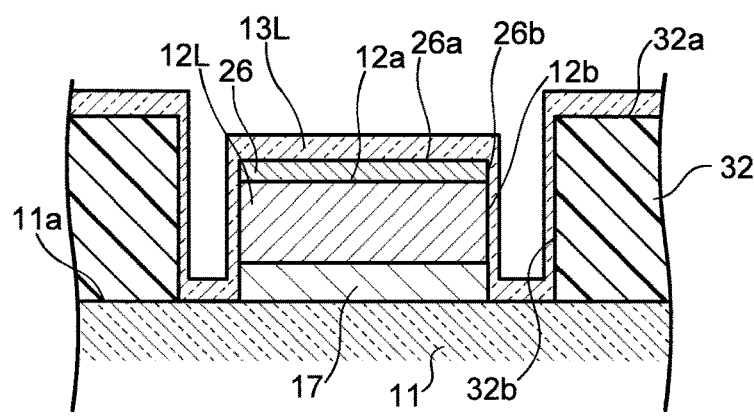
FIG. 18E is a diagram for explaining the method of manufacturing the capacitor according to the thirteenth embodiment of the present disclosure.
Figure 18F:
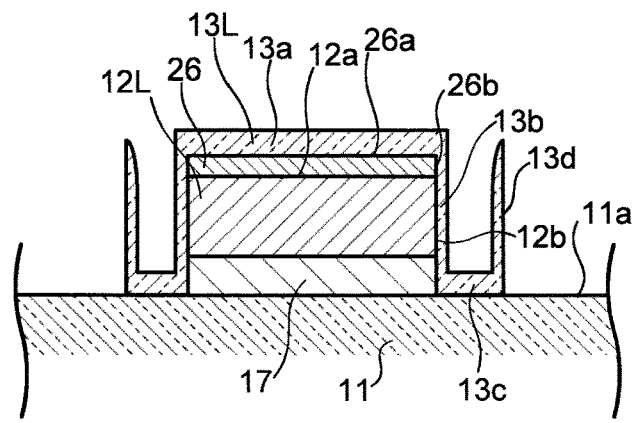
FIG. 18F is a diagram for explaining the method of manufacturing the capacitor according to the thirteenth embodiment of the present disclosure.

Next, as shown in FIG. 18D, in the surrounding of the first conductive layer 12L, with a predetermined interval (corresponding to the above distance L2) from the first conductive layer 12L, the second resist layer 32 is formed. Next, as shown in FIG. 18E, the first insulating layer 13L is formed so as to cover the upper surface 26a and the side surface 26b of the intermediate layer 26, the side surface 12b of the first conductive layer 12L, the first surface 11a of the substrate 11, and, the upper surface 32a and the side surface 32b of the second resist layer 32. Then, as shown in FIG. 18F, the second resist layer 32 is removed by the lift-off. In the present embodiment, the second resist layer 32 is removed by the lift-off so as to leave at least a part of the first insulating layer 13L formed on the side surface 32b of the second resist layer 32. At the time of the lift-off, the first insulating layer 13L formed on the upper surface 32a of the second resist layer 32 is removed together with the second resist layer 32. Since the second resist layer 32 is removed such that the second resist layer 32 is pulled upward at the time of the lift-off, the fourth part 13d that becomes a tapered shape (a tapering shape) is formed. Thus, the first insulating layer 13L that has the first part 13a arranged on the intermediate layer 26, the second part 13b that covers the side surface 26b of the intermediate layer 26 and the side surface 12b of the first conductive layer 12L, the third part 13c that covers at least a part of the first surface 11a of the substrate 11, and the fourth part 13d formed so as to rise up from the first surface 11a of the substrate 11 is formed. Thereafter, as shown in FIG. 17, the second conductive layer 14 is formed on the first insulating layer 13L corresponding to a position of the intermediate layer 26.

Like the manufacturing method shown in the FIG. 18A to FIG. 18F, without using the etching as far as possible, by applying the formation process of a conductive layer and peeling of the resist (that is, lift-off), the number of the processes may be reduced. Furthermore, when a transparent substrate such as a glass substrate is used as the substrate 11, since the transparency of the glass substrate may be maintained more than the case where the etching is used frequently, a case where an optical element on which the transparency of the glass substrate influences is arranged in the vicinity of the MIM structure such as a capacitor is advantageous.

Figure 19:
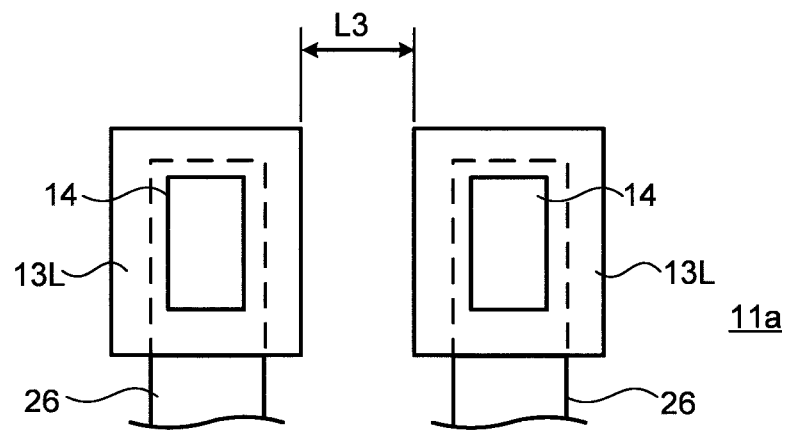
FIG. 19 is a diagram for explaining a positional relationship of the capacitor according to the thirteenth embodiment of the present disclosure.

FIG. 19 is a diagram describing a positional relationship of the capacitor 100L according to the thirteenth embodiment of the present disclosure. In the MIM structure such as the capacitor manufactured by using the lift-off, a distance between adjacent MIM structures (a distance from an end part of the first insulating layer 13L of a certain MIM structure to an end part of the first insulating layer 13L of the adjacent MIM structure) L3 is preferably 10 μm to 1 mm. A range of the L3 may be set by adjusting a width of the second resist layer 32 in FIG. 18D. By setting in the range of the L3, a time necessary for the lift-off process may be reduced to be a structure suitable for the lift-off.

Fourteenth Embodiment

Figure 20A:
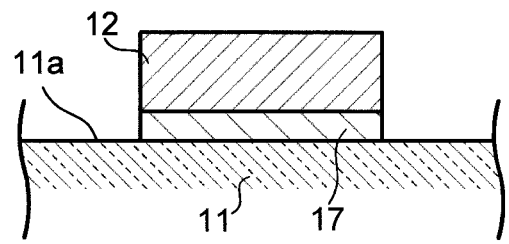
FIG. 20A is a diagram for explaining another method of manufacturing the capacitor according to the first embodiment of the present disclosure.
Figure 20B:
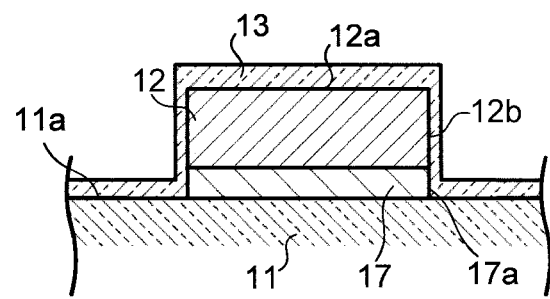
FIG. 20B is a diagram for explaining still another method of manufacturing the capacitor according to the first embodiment of the present disclosure.
Figure 20C:
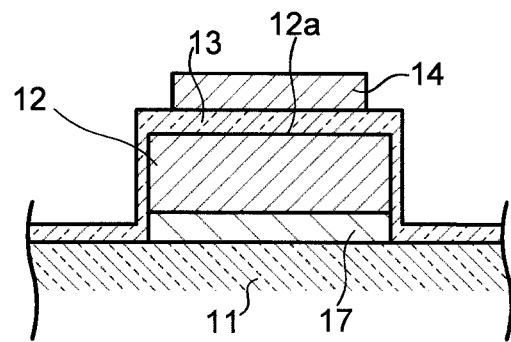
FIG. 20C is a diagram for explaining further still another method of manufacturing the capacitor according to the first embodiment of the present disclosure.
Figure 20D:
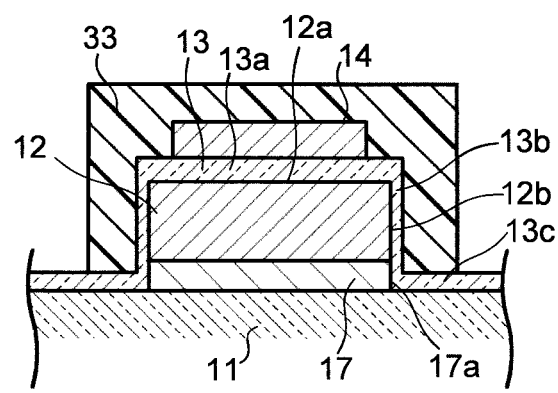
FIG. 20D is a diagram for explaining another method of manufacturing the capacitor according to the first embodiment of the present disclosure.
Figure 20E:
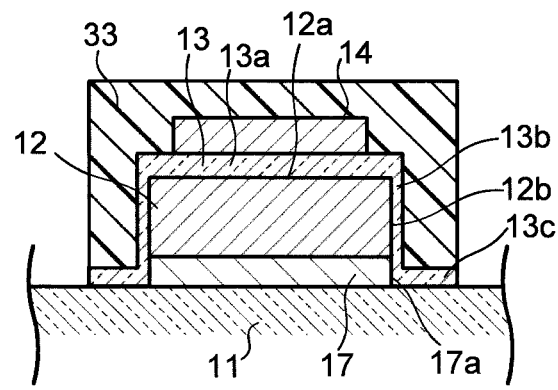
FIG. 20E is a diagram for explaining still another method of manufacturing the capacitor according to the first embodiment of the present disclosure.

FIG. 20A to FIG. 20E are diagrams for describing another method of manufacturing the capacitor 100 according to the first embodiment. Since the manufacturing method is different from the first embodiment, the method was shown as a fourteenth Embodiment. FIG. 20A is an expanded diagram of a first surface 11a side of a state of FIG. 4C. As shown in FIG. 20A, the first conductive layer 12 is formed on the first surface 11a of the substrate 11. Next, as shown in FIG. 20B, the first insulating layer 13 is formed on the upper surface 12a and side surface 12b of the first conductive layer 12, and the first surface 11a of the substrate 11. Then, as shown in FIG. 20C, the second conductive layer 14 is formed on a part of the first insulating layer 13 corresponding to the upper surface 12a of the first conductive layer 12. Then, as shown in FIG. 20D, a resist layer 33 is formed so as to cover the second conductive layer 14 and to cover a part (that is, a skirt part of the first insulating layer 13) of the third part 13c extending from the second part 13b of the first insulating layer 13 to the first surface 11a of the substrate 11. Next, as shown in FIG. 20E, the first insulating layer 13 that is not covered by the resist layer 33 is removed by an etching or milling treatment. Thereafter, the resist layer 33 is removed. Thus, the capacitor 100 shown in FIG. 3 may be manufactured. Here, as the etching process, for example, a reactive ion etching (RIE) process or the like may be used. Furthermore, as the milling treatment, for example, an Ar milling treatment may be used.

Figure 21A:
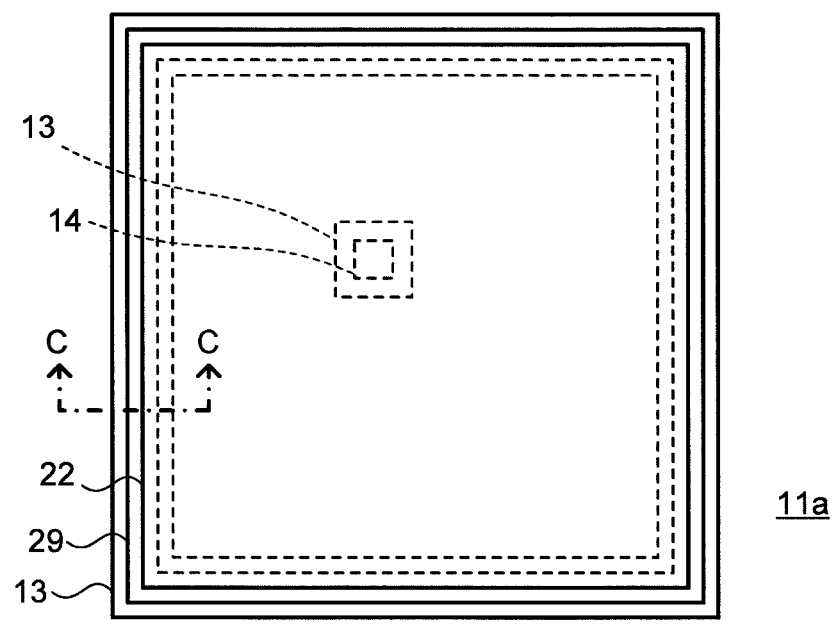
FIG. 21A is a schematic plan view showing an interposer according to the fourteenth embodiment of the present disclosure.

FIG. 21A is a schematic plan view showing an interposer 10 according to the fourteenth embodiment of the present disclosure. In more detail, FIG. 21A is a schematic plan view of the interposer 10 including the capacitor 100 manufactured according to a method of the FIG. 20A to FIG. 20E shown above. In FIG. 21A, many constituent elements are omitted for convenience of description, and regarding the capacitor 100, only a part of the first insulating layer 13 and the second conductive layer 14 formed on the first surface 11a side of the substrate 11 is shown. On the first surface 11a of the substrate 11, the resin layer 22 is formed so as to cover the capacitor 100 (MIM structure). In the surrounding of an area where the capacitor 100 is arranged, an annular conductive layer 29 and the first insulating layer 13 are formed along an end part of the resin layer 22.

Figure 21B:
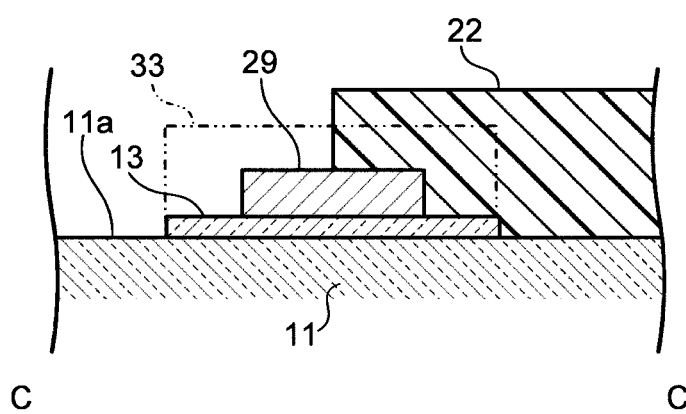
FIG. 21B is a schematic cross-sectional view (a C-C line cross-sectional view of FIG. 21A) showing an annular conductive layer 29 included in the interposer in the fourteenth embodiment of the present disclosure.

FIG. 21B is a schematic cross-sectional view (a C-C line cross-sectional view of FIG. 21A) showing the annular conductive layer 29 included in the interposer in the fourteenth embodiment of the present disclosure. The conductive layer 29 is arranged on the first insulating layer 13 formed similarly in an annular shape. Preferably, a width of the first insulating layer 13 is larger than a width of the conductive layer 29. The conductive layer 29 may be formed at the time of a manufacturing method of FIG. 20C. For example, the conductive layer 29 may be formed simultaneously with a process of manufacturing the second conductive layer 14. When the second conductive layer 14 is formed in the process of FIG. 20C, along a scheduled position where an end part of the resin layer 22 is formed, the annular conductive layer 29 is also formed on the first insulating layer 13. Thereafter, in the process of FIG. 20D, the resist layer 33 is formed at a width larger than a width of the conductive layer 29 as shown with a two-dot chain line of FIG. 21B. Thus, even when the process of removing the first insulating layer 13 is applied, the first insulating layer 13 having a larger width than the conductive layer 29 remains. According to the constitution, since, at a position of an end part of the resin layer 22, the first insulating layer 13 having a width larger than the conductive layer 29 is arranged between the conductive layer 29 and the substrate 11, the adhesiveness at the end part of the resin layer 22 is improved by the first insulating layer 13.

Fifteenth Embodiment to Nineteenth Embodiment

Next, by means of FIG. 22 to FIG. 24, constitutions of capacitors (first conductive layer, first insulating layer and second conductive layer) according to fifteenth Embodiment to nineteenth Embodiment will be described. The constitutions described with these diagrams may be applied as the constitutions of capacitors in all embodiment described above.

Figure 22A:
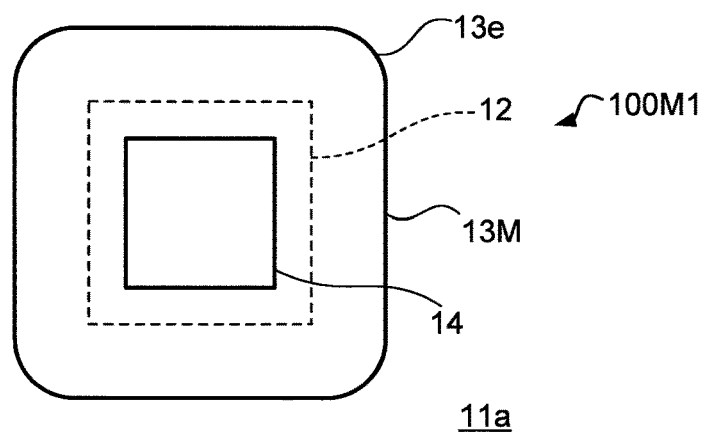
FIG. 22A is a schematic plan view showing a capacitor according to a fifteenth embodiment of the present disclosure.
Figure 22B:
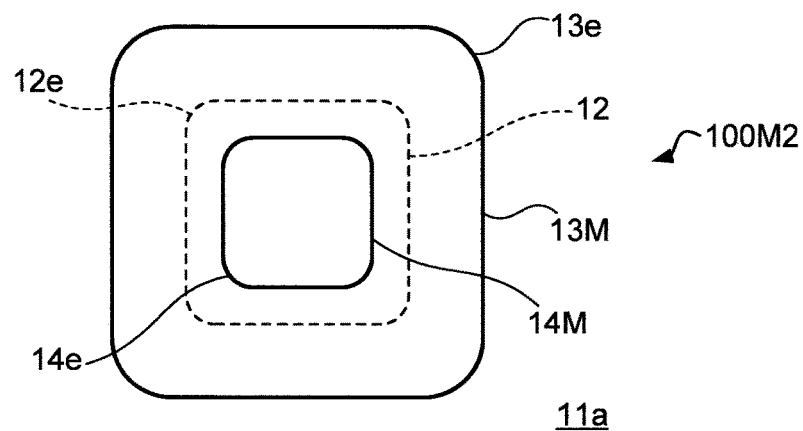
FIG. 22B is a schematic plan view showing a capacitor according to a sixteenth embodiment of the present disclosure.

FIG. 22A is a schematic plan view showing a capacitor 100M1 according to the fifteenth embodiment of the present disclosure. FIG. 22B is a schematic plan view showing a capacitor 100M2 according to the sixteenth Embodiment of the present disclosure. These schematic plan views are plan views when the first surface 11a of the substrate 11 is as seen from above. At least one of a plurality of corner parts 13e of a first insulating layer 13M may have a round shape. As shown in FIG. 22A, preferably, all of four corner parts 13e of the first insulating layer 13M have the round shape. Preferably, a curvature radius of the corner part 13e is 5 µm or larger. According to this constitution, concentration of the stress on the corner part 13e may be alleviated to be able to prevent peeling of the first insulating layer 13M.

As shown in FIG. 22B, at least one of the plurality of corner parts 12e of the first conductive layer 12M may have a round shape. Preferably, all of four corner parts 12e of the first conductive layer 12M have the round shape. Furthermore, at least one of the plurality of corner parts 14e of the second conductive layer 14M may have the round shape. Preferably, all of four corner parts 14e of the second conductive layer 14M have the round shape. According to this constitution, also in each of the first conductive layer 12M and second conductive layer 14M, the stress on the corner parts may be alleviated to be able to improve the resistance to the peeling as a capacitor (MIM structure) as a whole. In addition, when corner parts of at least one of the first conductive layer 12M and the second conductive layer 14M are formed into the round shape, an effect of the resistance to the peeling may be obtained. The curvature radii of the corner parts of the first conductive layer 12M and second conductive layer 14M are preferably 5 µm or larger.

Figure 23:
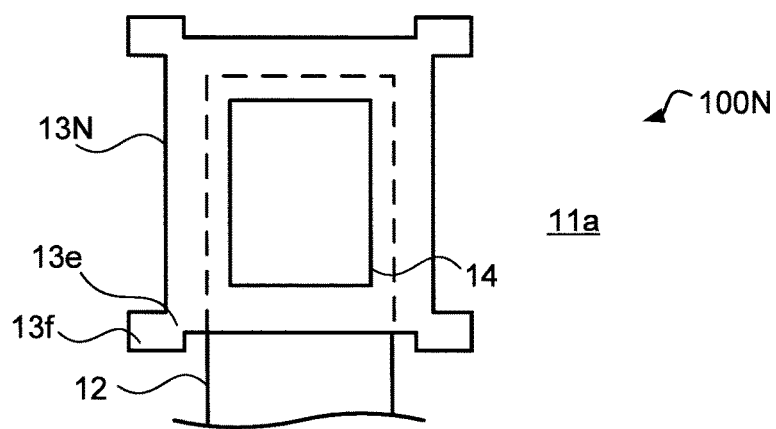
FIG. 23 is a schematic plan view showing a capacitor according to a seventeenth embodiment of the present disclosure.

FIG. 23 is a schematic plan view showing a capacitor 100N according to the seventeenth embodiment of the present disclosure. The schematic plan view is a plan view when the first surface 11a of the substrate 11 is seen from above. A constitution of preventing the peeling is not limited to the round shape. For example, a plurality of corner parts 13e of the first insulating layer 13N may have a reinforcement part 13f. In an example of FIG. 23, the corner part 13e has a square reinforcement part 13f in plan view. By reinforcing the corner part 13e usually formed into a pointed shape with a wide reinforcement part 13f, peeling from the corner part 13e may be prevented. In addition, a shape of the reinforcement part 13f is not limited to a square and may be other shapes as long as the structure contributes to prevention of the peeling. For example, as the other shapes, a shape that expands from the corner part 13e into the surrounding and surrounded by a straight line exemplified in the present embodiment, a shape surrounded by a curved line such as a circle, or a shape surrounded by a combination of a straight line and a curved line may be used.

Figure 24A:
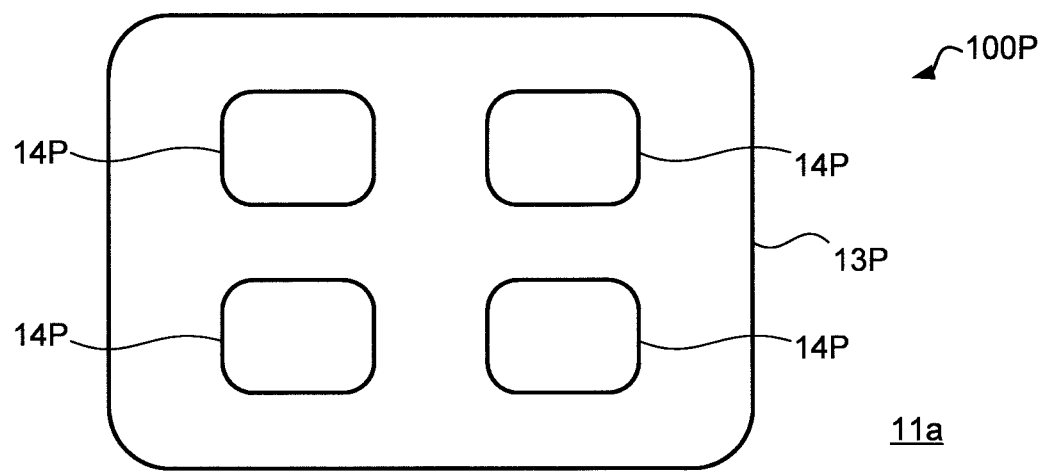
FIG. 24A is a schematic plan view showing a capacitor according to an eighteenth embodiment of the present disclosure.
Figure 24B:
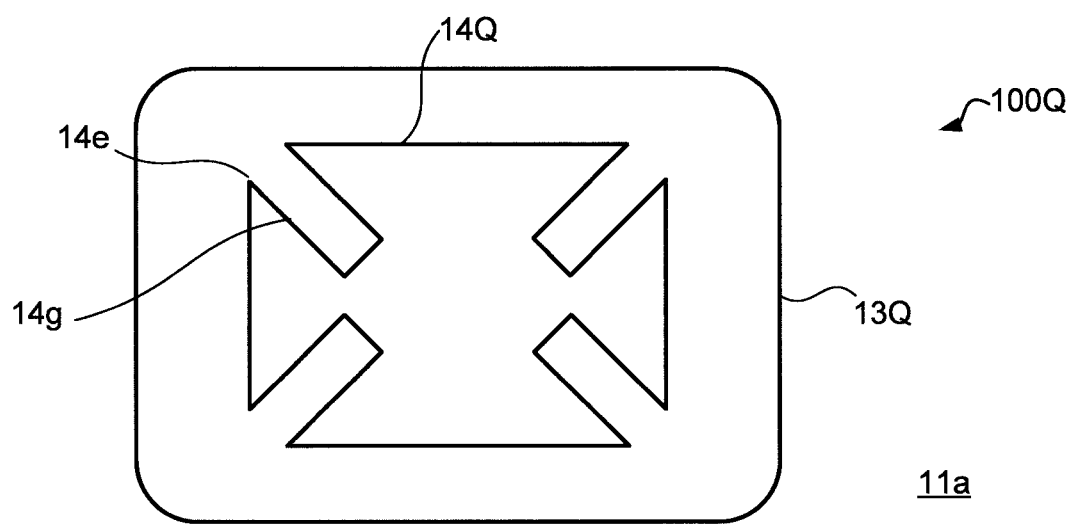
FIG. 24B is a schematic plan view showing a capacitor according to a nineteenth embodiment of the present disclosure.

FIG. 24A is a schematic plan view showing a capacitor 100P according to the eighteenth embodiment of the present disclosure. FIG. 24B is a schematic plan view showing a capacitor 100Q according to the nineteenth Embodiment of the present disclosure. These schematic plan views are plan views when the first surface 11a of the substrate 11 is seen from above. A plurality of the second conductive layers 14P may be formed (patterned) independently from each other on the first insulating layer 13P. In an example of FIG. 24A, the second conductive layer 14P on the first insulating layer 13P is constituted of four conductive parts. As shown in the diagram, each corner part of the four conductive parts may have a round shape.

Furthermore, as shown in FIG. 24B, the second conductive layer 14Q may have slit parts 14g formed so as to extend from a corner part 14e toward the inside. As exemplified in constitutions of FIG. 24A and FIG. 24B, by appropriately modifying the pattern of the second conductive layer 14, the degree of freedom of design may be improved. For example, when the second conductive layer 14 is connected with a conductive layer of an adjacent capacitor (MIM structure), and when the second conductive layer 14 is connected with a semiconductor chip 50 or a wiring board 40, the degree of freedom for design may be improved.

Twentieth Embodiment to Twenty-second Embodiment

Figure 25A:
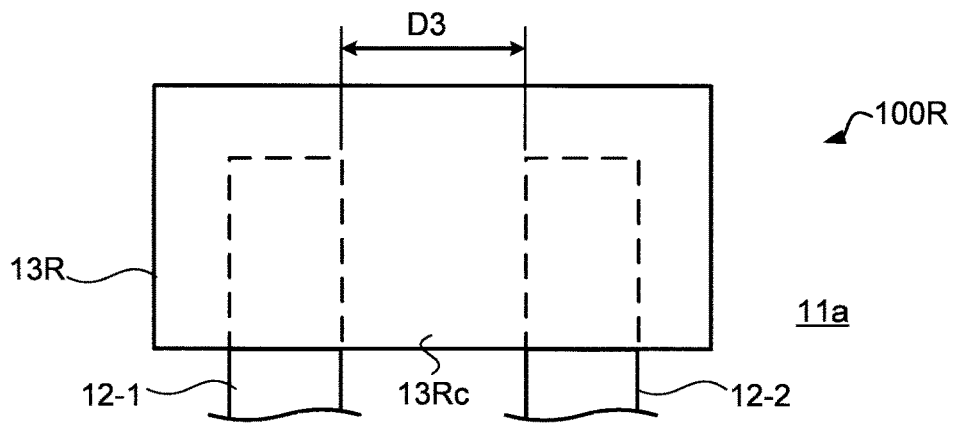
FIG. 25A is a schematic plan view showing a positional relationship of a first conductive layer and a first insulating layer of a capacitor according to a twentieth embodiment of the present disclosure.
Figure 25B:
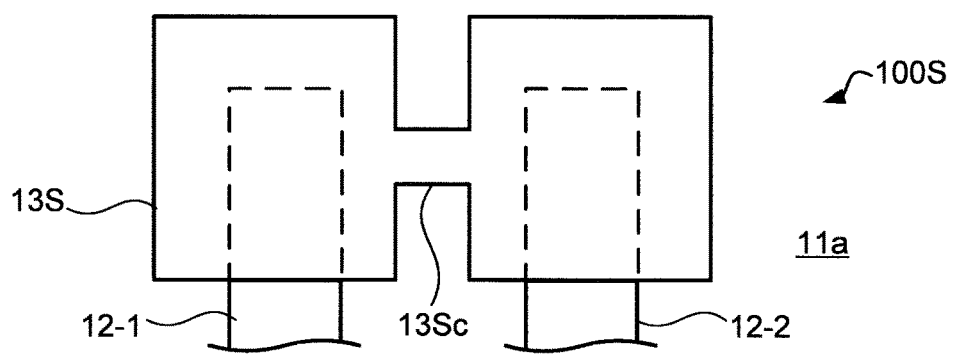
FIG. 25B is a schematic plan view showing a positional relationship of a first conductive layer and a first insulating layer of a capacitor according to a twenty-first embodiment of the present disclosure.
Figure 25C:
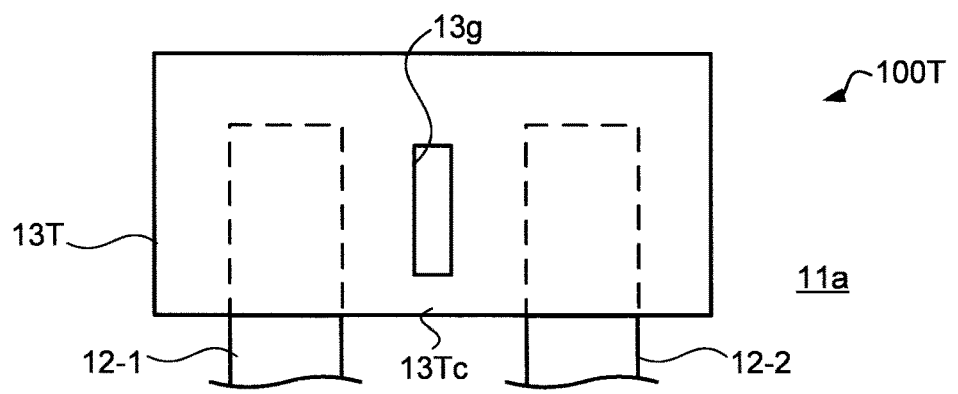
FIG. 25C is a schematic plan view showing a positional relationship of a first conductive layer and a first insulating layer of a capacitor according to a twenty-second embodiment of the present disclosure.

Next, a constitution where a plurality of capacitors (MIM structure) are juxtaposed will be described. A constitution described below is applicable to all embodiments described above. FIG. 25A is a schematic plan view showing a positional relationship between the first conductive layers 12-1, 12-2 and a first insulating layer 13R of a capacitor 100R according to a twentieth embodiment of the present disclosure. FIG. 25B is a schematic plan view showing a positional relationship between the first conductive layers 12-1, 12-2 and a first insulating layer 13S of a capacitor 100S according to a twenty-first embodiment of the present disclosure. FIG. 25C is a schematic plan view showing a positional relationship between the first conductive layers 12-1, 12-2 and the first insulating layer 13T of a capacitor 100T according to a twenty-second embodiment of the present disclosure. These schematic plan views are plan views when the first surface 11a of the substrate 11 is seen from above. In FIG. 25A to FIG. 25C, the second conductive layer 14 is omitted from showing.

Like the capacitor 100R shown in FIG. 25A, the first insulating layer 13R may be arranged over adjacent first conductive layers 12-1, 12-2. That is, the first insulating layer 13R has a part covering a part of each of the adjacent first conductive layers 12-1, 12-2, and, on the first surface 11a of the substrate 11, the third part 13Rc connecting these parts. Thus, the third part 13Rc is formed so as to be connected between adjacent conductive layers 12-1, 12-2. In the example, the first insulating layer 13R has a rectangular shape in plan view. In the manufacturing process of the interposer 10, when a distance (in more detail, a distance D3 between the first conductive layers 12-1, 12-2) between adjacent capacitors (MIM structures) becomes smaller, there are cares that a resolution limit of the resist is reached, and a shape of the film becomes unstable, or an extraneous material is generated. These may be a generation source of the film peeling. In particular, the first conductive layers 12-1, 12-2 are, when formed together with the through electrode 20, formed very thick compared with a thickness necessary for realizing a function as the capacitor. Therefore, when the distance D3 becomes smaller, an aspect ratio of a slit formed between the first conductive layers 12-1, 12-2 becomes larger to be difficult to control the thickness of the resist in the slit. As the result, it is difficult to control a shape of the first insulating layer 13R.

When the first insulating layers 13R are connected between the adjacent first conductive layers 12-1, 12-2 without separating for every capacitor, without worrying about the resolution limit of the resist, the degree of freedom for design may be improved. Furthermore, the shape of the film is stabilized, and occurrence of extraneous material may be also prevented. Still furthermore, since the problems in the manufacturing processes described above may be dissolved, compared with the case where the adjacent first conductive layers 12-1, 12-2 each are covered with a separate first insulating layer 13, a distance between the adjacent first conductive layers 12-1, 12-2 may be reduced. Accordingly, high density of the wirings may be obtained.

In addition, in the constitution described above, the distance D3 is preferably 10 μm to 100 μm.

As the shape of the first insulating layer 13R, other shapes may be adopted. Like the capacitor 100S shown in FIG. 25B, the first insulating layer 13S on the adjacent first conductive layers 12-1, 12-2 may be formed so as to be partially connected. That is, the third part 13Sc of the first insulating layer 13S on the first surface 11a of the substrate 11 may be formed such that its width becomes narrow between the adjacent first conductive layers 12-1, 12-2 and may be formed so as to be connected between the adjacent first conductive layers 12-1, 12-2. Furthermore, like the capacitor 100T shown in FIG. 25C, the third part 13Tc of the first insulating layer 13 on the first surface 11a of the substrate 11 may have a slit part 13g.

In addition, in FIG. 25A to FIG. 25C, examples where the first insulating layers 13R, 13S and 13T are formed over adjacent two first conductive layers 12-1, 12-2 are shown. However, the first insulating layers 13R, 13S and 13T may be arranged over three or more first conductive layers 12 in the similar shapes (the third parts 13Rc, 13Sc and 13Tc between the respective first conductive layers) as FIG. 25A to FIG. 25C, respectively. Furthermore, although the shapes of the first insulating layers 13R, 13S and 13T are constituted of an outer edge of a straight line in plain view, by considering the degree of freedom for design, the resolution of the resist, or the adhesiveness with the first surface 11a, the outer edge may be constituted with a curved line.

Figure 26A:
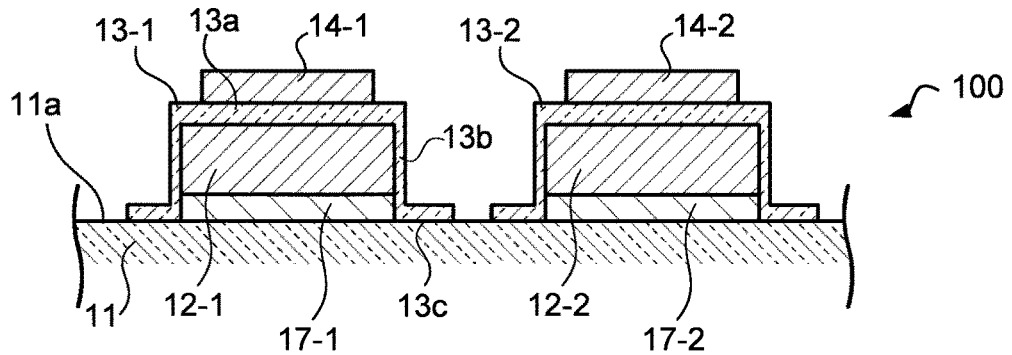
FIG. 26A is a schematic cross-sectional view when the capacitors according to the first embodiment of the present disclosure are juxtaposed.
Figure 26B:
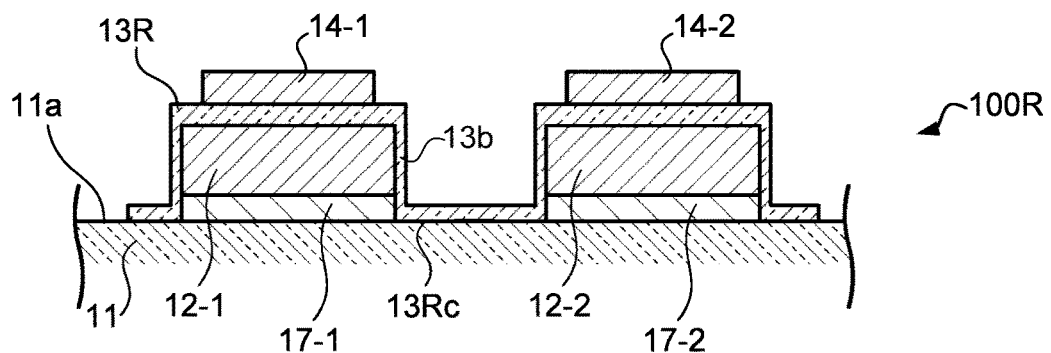
FIG. 26B is a schematic cross-sectional view for explaining example of arrangement of a second conductive layer of the capacitor according to the twentieth embodiment of the present disclosure.
Figure 26C:
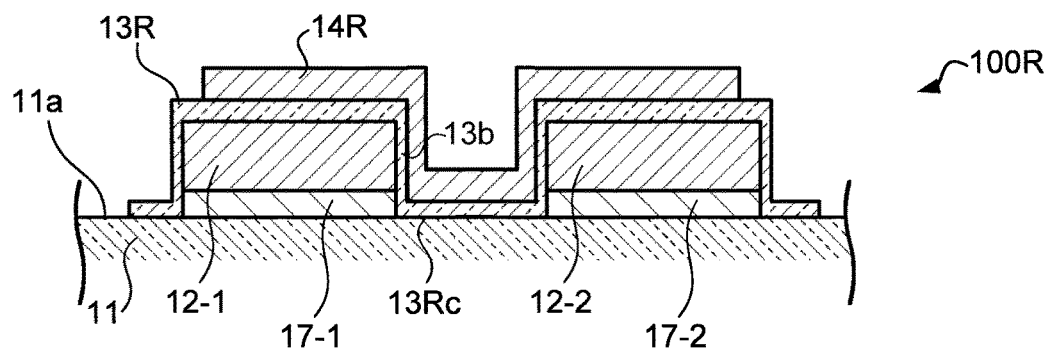
FIG. 26C is a schematic cross-sectional view for explaining another example of arrangement of the second conductive layer of the capacitor according to the twentieth embodiment of the present disclosure.

FIG. 26A is a schematic cross-sectional view when the capacitors 100 according to the first embodiment of the present disclosure are juxtaposed. FIG. 26B is a schematic cross-sectional view for explaining an example of an arrangement of the second conductive layer 14 of the capacitor 100R according to the twentieth embodiment of the present disclosure. FIG. 26C is a schematic cross-sectional view for explaining another example of arrangement of the second conductive layer 14R of the capacitor 100R according to the twentieth embodiment of the present disclosure. These schematic cross-sectional views are schematic cross-sectional views of adjacent capacitors (MIM structure). FIG. 26A shows a constitution in which the capacitors 100 according to the first embodiment shown in FIG. 3 are juxtaposed. That is, a part of the first conductive layer 12-1 and a part of the first surface 11a of the substrate 11 are covered with the first insulating layer 13-1, and the second conductive layer 14-1 is formed on the first insulating layer 13-1. Furthermore, a part of the first conductive layer 12-2 and a part of the first surface 11a of the substrate 11 are covered with the first insulating layer 13-2, and the second conductive layer 14-2 is formed on the first insulating layer 13-2.

FIG. 26B is an example of a constitution shown in FIG. 25A to FIG. 25C. Here, a case where FIG. 26B corresponds to an example of FIG. 25A will be described. The first insulating layer 13R is, as was described above, formed over adjacent first conductive layers 12-1, 12-2. The first insulating layer 13R is formed such that the third part 13Rc is arranged on the first surface 11a of the substrate 11 between adjacent first conductive layers 12-1, 12-2 to connect the first insulating layer 13R on the first conductive layer 12-1 and the first insulating layer 13R on the first conductive layer 12-2. The second conductive layer 14-1 is formed on a part corresponding to the first conductive layer 12-1 in the first insulating layer 13R, and the second conductive layer 14-2 is formed on a part corresponding to the first conductive layer 12-2 in the first insulating layer 13R.

FIG. 26C is other examples of the constitutions shown in FIG. 25A to FIG. 25C. Here, a case where FIG. 26C corresponds to an example of FIG. 25A will be described. The first insulating layer 13R is formed over the adjacent first conductive layers 12-1, 12-2. The second conducive layer 14R is also formed in the same manner. Specifically, the second conductive layer 14R is formed over a part corresponding to the first conductive layer 12-1 in the first insulating layer 13R, and a part corresponding to a third part 13Rc of the first insulating layer 13R between adjacent first conductive layers 12-1, 12-2, and the first conductive layer 12-2 in the first insulating layer 13R.

Twenty-Third Embodiment

Figure 27:
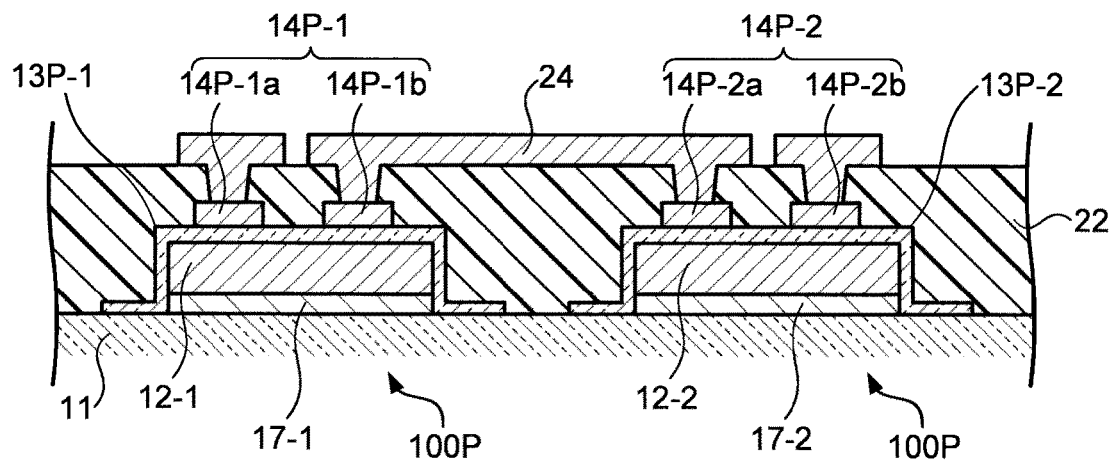
FIG. 27 is a schematic cross-sectional view of a capacitor according to a twenty-third embodiment of the present disclosure.

FIG. 27 is a schematic cross-sectional view when the capacitors 100P according to a twenty-third embodiment of the present disclosure are juxtaposed. This example shows a modification example of the constitution of FIG. 24A. A second conductive layer 14P-1 on the first insulating layer 13P-1 may be constituted of a plurality of mutually separated conductive parts (first conductive part 14P-1a and second conductive part 14P-1b). Furthermore, the second conductive layer 14P-2 on the first insulating layer 13P-2 may be constituted of a plurality of conductive parts (the first conductive part 14P-2a and second conductive part 14P-2b). In the constitution like this, a part of the second conductive layer 14P-1 and a part of the second conductive layer 14P-2 may be electrically connected. In an example of FIG. 27, a second conductive 14P-1b of the second conductive layer 14P-1 and a first conducive part 14P-2a of the second conductive layer 14P-2 are connected via a connection part 24.

Twenty-Fourth Embodiment

Figure 28:
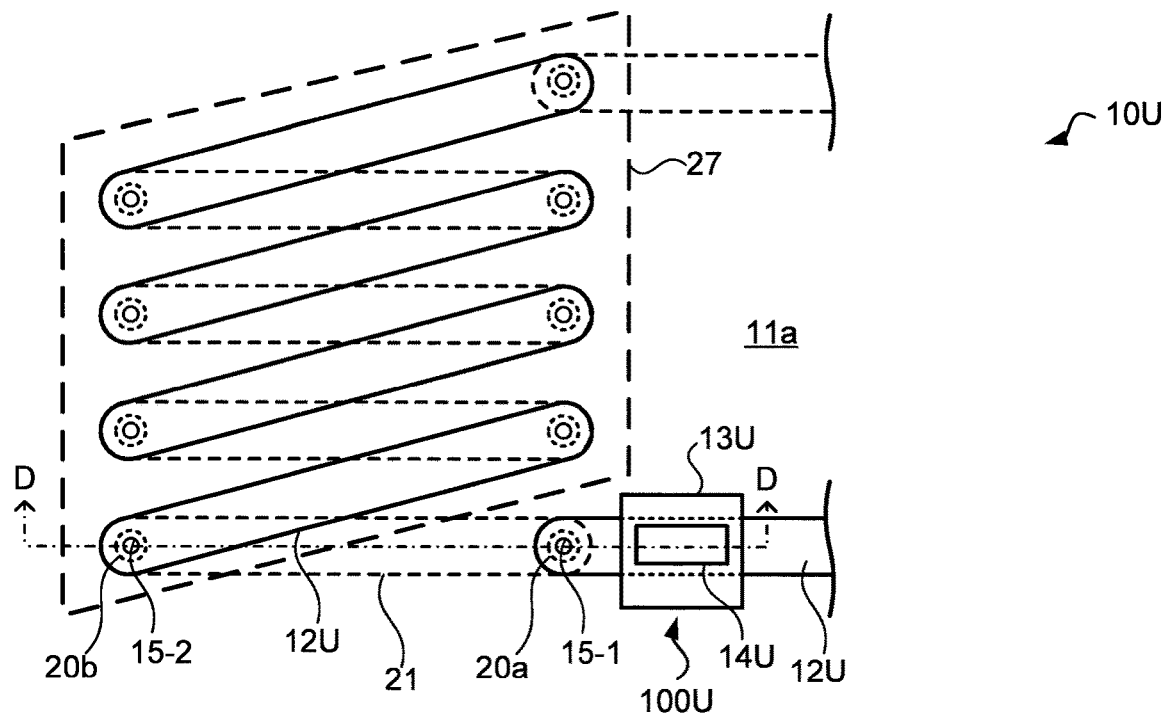
FIG. 28 is a schematic plan view showing a capacitor and an inductor included in an interposer according to a twenty-fourth embodiment of the present disclosure.
Figure 29:
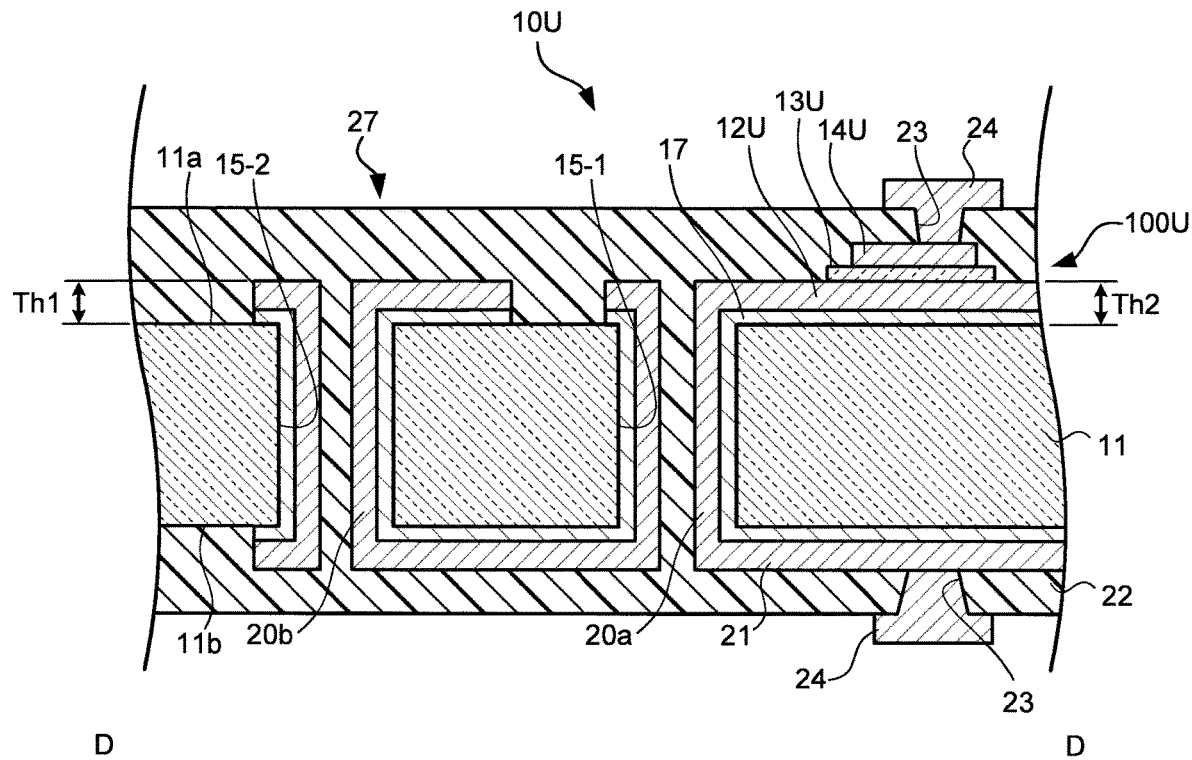
FIG. 29 is a schematic cross-sectional view (a D-D line cross-sectional view of FIG. 28) showing the interposer according to the twenty-fourth embodiment of the present disclosure.

FIG. 28 is a schematic plan view showing a capacitor 100U and an inductor 27 included in an interposer 10U according to a twenty-fourth embodiment of the present disclosure. The schematic plan view is a plan view showing a first conductive layer 12U on the first surface 11a side of the substrate 11. In FIG. 28, a part of constituent elements such as the connection part 24 are omitted. FIG. 29 is a schematic cross-sectional view (a D-D line cross-sectional view of FIG. 28) showing the interposer according a 24th embodiment of the present disclosure.

As shown in FIG. 28, the interposer 10U may be provided with at least the inductor 27 and capacitor 100U. The interposer 10U may have a through electrode 20a electrically connected with a first conductive layer 12U and a plurality of through electrodes 20b constituting the inductor 27. The through electrode 20a is formed in a through hole 15-1 between the inductor 27 and the capacitor 100U (the first conductive layer 12U, the first insulating layer 13U and the second conductive layer 14U). Furthermore, a plurality of the through electrodes 20b is formed in each of a plurality of through holes 15-2 within a range surrounded by a dotted line of the inductor 27.

As shown in FIG. 29, a part of the first conductive layer 12U on the first surface 11a side of the substrate 11 constitutes the inductor 27, and another part of the first conductive layer 12U constitutes a lower electrode of the capacitor 100U. On the first surface 11a side of the substrate 11, a thickness Th1 of the first conductive layer 12U constituting the inductor 27 may be substantially the same as a thickness Th2 of the first conductive layer 12U constituting the lower electrode of the capacitor 100U. In addition, when thicknesses of the both satisfy the following relationship, these are regarded as substantially the same.

−10%≤(Th1−Th2)/Th1≤+10%

The thickness of the first conductive layer 12U may be 0.5 μm to 20 μm, as was described above, and, more preferably may be 5 μm to 20 μm. This is because the performance of the inductor 27 is improved. Thicknesses of the through electrodes 20a, 20b may be 50% to 100% of the thickness of the first conductive layer 12U in the first surface 11a of the substrate 11.

Twenty-Fifth Embodiment

Figure 30:
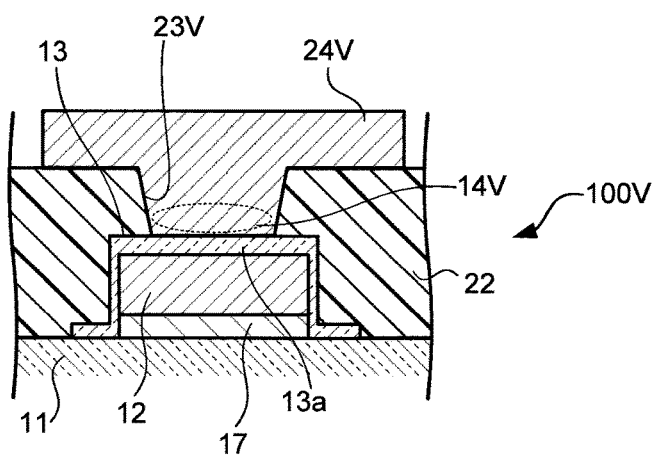
FIG. 30 is a schematic cross-sectional view showing a capacitor according to a twenty-fifth embodiment of the present disclosure.

FIG. 30 is a schematic plan view showing a capacitor 100V according to a twenty-fifth embodiment of the present disclosure. In the present embodiment, an example where the second conductive layer 14 of the capacitor 100 in the first embodiment is shared with the connection part 24 is shown. A via hole 23V formed in the resin layer 22 is provided separately from the via hole 23 for exposing a conductive layer such as the first conductive layer 12 or the like, for example, the via hole 23 of FIG. 2, and is formed so as to expose the first part 13a of the first insulating layer 13. In the present example, when the via hole 23 is formed, the via hole 23V is also formed. Furthermore, when the connection part 24 is formed corresponding to the via hole 23, the connection part 24V is formed also in the via hole 23V. In addition, the via hole 23 and the via hole 23V may be formed separately. Furthermore, the connection part 24V may be formed separately also from the connection part 24. Also according to the constitution, a lower part 14V of the connection part 24V functions similarly as the second conductive layer 14 in the first embodiment. In addition, the lower part 14V includes a part contacting with the first insulating layer 13.

Twenty-Sixth Embodiment

In a twenty-sixth embodiment, a semiconductor device manufactured with the interposer 10 in the first embodiment will be described.

Figure 31:
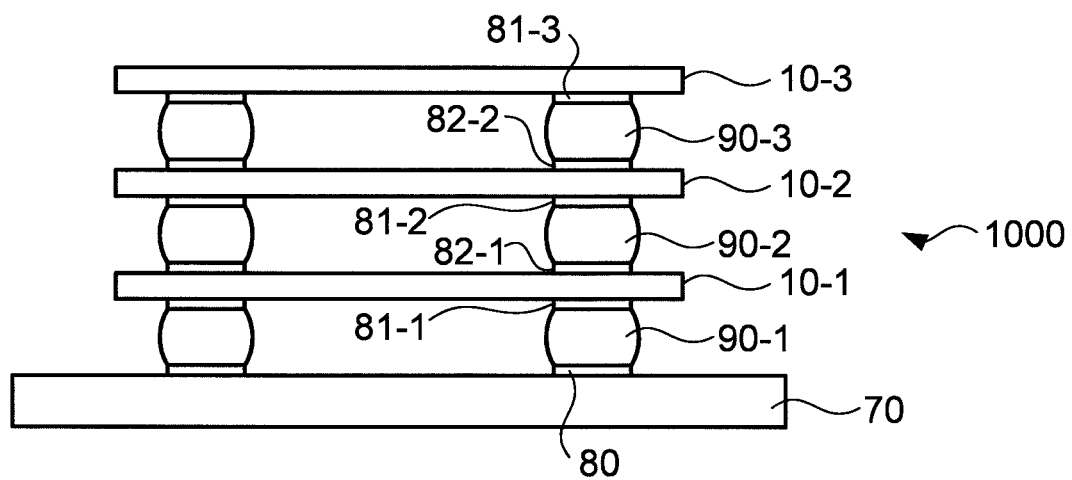
FIG. 31 is a diagram showing a semiconductor device in a twenty-sixth embodiment of the present disclosure.

FIG. 31 is a diagram showing a semiconductor device in the twenty-sixth embodiment of the present disclosure. A semiconductor device 1000 includes stacked three interposers 10 (10-1, 10-2, 10-3) and is connected to an LSI substrate 70. The interposer 10-1 includes a semiconductor element such as DRAM, and includes connection terminals 81-1, 82-1 formed of the connection part 24. These interposers 10 (10-1, 10-2, 10-3) may not be ones that use a glass substrate or a part of the interposers 10 may be ones that use a substrate of a material different from other interposer 10. The connection terminal 81-1 is connected to the connection terminal 80 of the LSI substrate 70 via a bump 90-1. The connection terminal 82-1 is connected to the connection terminal 81-2 of the interposer 10-2 via a bump 90-2. Also the connection terminal 82-2 of the interposer 10-2 and the connection terminal 83-1 of the interposer 10-3 are connected via a bump 90-3. The bumps 90 (90-1, 90-2, 90-3) use a metal, for example, indium, copper, or gold.

In addition, when the interposers 10 are stacked, without limiting to three layers, two layers may be used, furthermore, four or more layers may be used. Furthermore, connection between the interposer 10 and another substrate may use, without limiting to one that uses a bump, other connection technology such as the eutectic bonding. Furthermore, by coating a polyimide or epoxy resin and by baking it, the interposer 10 and another substrate may be adhered.

Figure 32:
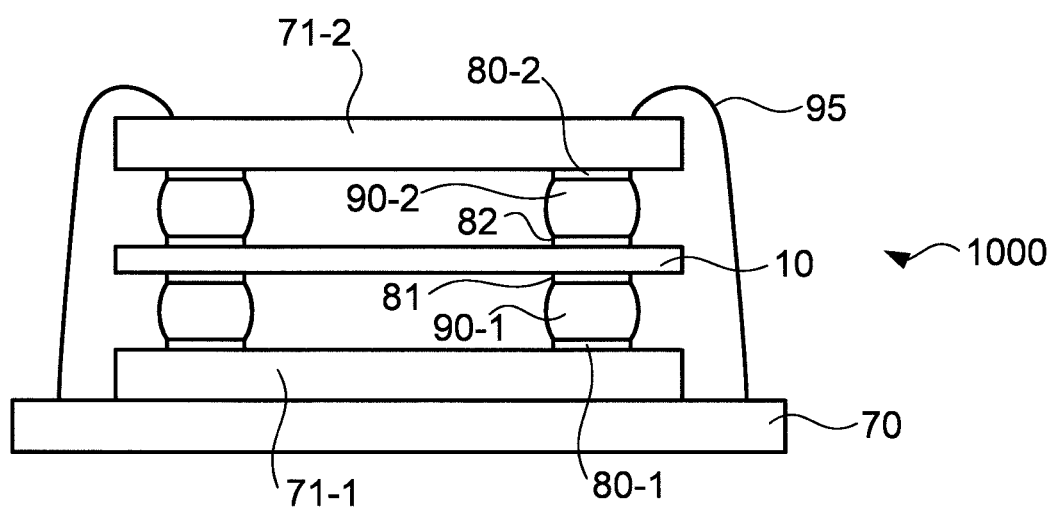
FIG. 32 is a diagram showing another example of the semiconductor device in the twenty-sixth embodiment of the present disclosure.

FIG. 32 is a diagram showing another example of the semiconductor device in the twenty-sixth embodiment of the present disclosure. The semiconductor device 1000 shown in FIG. 32 has a stacked structure in which semiconductor circuit boards (semiconductor chips) 71-1, 71-2, such as a MEMS device, a CPU, and a memory, and the interposer 10 are stacked and is connected to the LSI substrate 70.

The interposer 10 is arranged between the semiconductor circuit board 71-1 and semiconductor circuit board 71-2 and connected to these via the bump 90-1, 90-2, respectively. The semiconductor circuit board 71-1 is placed on the LSI substrate 70. The LSI substrate 70 and the semiconductor circuit board 71-2 are connected with a wire 95. In this example, the interposer 10 is used as an interposer for three-dimensionally mounting by stacking a plurality of the semiconductor circuit boards. By connecting the interposer 10 to the plurality of semiconductor circuit boards each having different function, a semiconductor device having many functions may be realized. For example, when the semiconductor circuit board 71-1 is assigned to a three-axial acceleration sensor and the semiconductor circuit board 71-2 is assigned to a biaxial magnetic sensor, a semiconductor device that realizes a 5-axis motion sensor in one module may be realized.

When the semiconductor circuit board is a sensor formed of a MEMS device, a sensing result may be output as an analogue signal. In this case, also a low pass filter, an amplifier or the like may be formed into the semiconductor circuit board or the interposer 10.

Figure 33:
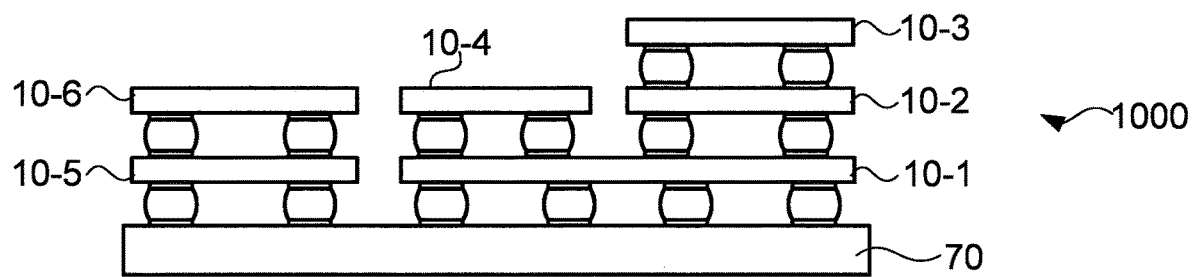
FIG. 33 is a diagram showing still another example of the semiconductor device in the twenty-sixth embodiment of the present disclosure.

FIG. 33 is a diagram showing still another example of the semiconductor device in the twenty-sixth embodiment of the present disclosure. The above two examples (FIG. 31, FIG. 32) were three-dimensional mounting, in this example, an example applied to a 2.5 dimensional mounting is shown. In an example shown in FIG. 33, on the LSI substrate 70, six interposers 10 (10-1 to 10-6) are stacked and connected. However, not only all interposers 10 are stacked and arranged but also arranged in parallel also in the direction in the substrate plane.

In an example of FIG. 33, the interposers 10-1, 10-5 are connected on the LSI substrate 70, the interposers 10-2, 10-4 are connected on the interposer 10-1, the interposer 10-3 is connected on the interposer 10-2, and the interposer 10-6 is connected on the interposer 10-5. In addition, like an example shown in FIG. 33, even when the interposer 10 is used as an interposer for connecting a plurality of semiconductor circuit boards, the 2.5 dimension mounting like this is possible. For example, the interposers 10-3, 10-4, 10-6 may be substituted with the semiconductor circuit board.

The semiconductor device 1000 manufactured as was described above is mounted on various electronic devices such as a portable terminal, an information processor, a home appliance or the like. More specific examples of the portable terminal include a portable telephone, a smartphone, and a note-type personal computer. More specific examples of the information processor include a desk top type personal computer, a server, and a car navigator. In addition, examples of the electronic devices include a wireless local area network (LAN) device, a set top box; a music player, a video player; an entertainment unit, a navigation device, a communication device, a portable information terminal (PDA), and a stationary data unit.

Figure 34:
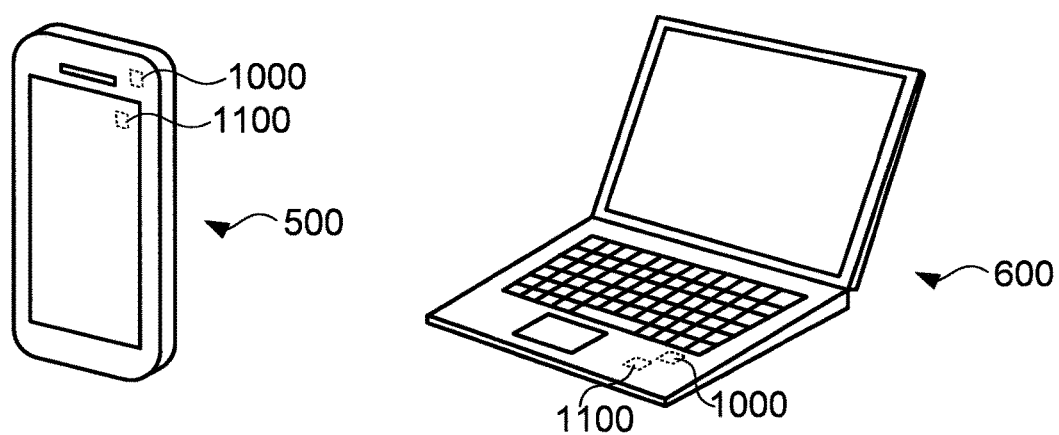
FIG. 34 is a diagram for explaining one example of an electronic device that used the semiconductor device in the twenty-sixth embodiment of the present disclosure.

FIG. 34 is a diagram for describing an example of an electronic device that uses the semiconductor device in the twenty-sixth embodiment of the present disclosure.

As an example of an electronic device on which the semiconductor device 1000 is mounted, a smartphone 500 and a note type personal computer 600 are shown. These electronic devices have a controller 1100 constituted of a CPU or the like that executes an application program to realize various kinds of functions. In the various kinds of functions, a function that uses an output signal from the semiconductor device 1000 is included. In addition, the semiconductor device 1000 may have a function of the controller 1100.

Modified Example

The present disclosure is not limited to the above-described embodiments and includes other various modified examples. For example, the above embodiments are ones that are detailed to explain the present disclosure more easily understandable and are not necessarily limited to ones having all described constitutions. Furthermore, a part of constitution of one embodiment may be substituted with a constitution of another embodiment, furthermore, a constitution of another embodiment may be added to the constitution of one embodiment. Still furthermore, regarding a part of a constitution of the respective embodiments, addition, elimination, or substitution of other constitutions may be applied. In what follows, a part of the modified examples will be described.

(1) The substrate 11 in which the above through electrode 20 was formed was described with the case used as the interposer arranged between the wiring board and the semiconductor chip as an example, but is not limited to this. That is, the substrate 11 on which the above through electrode 20 was formed may be used as a through electrode substrate. Here, the through electrode substrate includes not only the interposer arranged between the wiring board and the semiconductor chip but also an IPD (Integrated Passive Device) on which the semiconductor chip or the like is not arranged. In this case, an aspect where one of an upper side and a lower side of the wiring board is present so as to electrically connect with the through electrode is formed. On the other hand, the semiconductor chip or the like may be arranged at a position different from the through electrode substrate on the wiring board and may be electrically connected with the wiring board.

(2) In the capacitor in each of the above embodiments, for example, in the capacitor 100, an aspect where the first insulating layer 13 is laterally symmetrically arranged on the drawing in the side surface 12b of the first conductive layer 12 is illustrated but is not limited to this. For example, the side surface 12b on the left side of the first conductive layer 12 and the first surface 11a of the substrate 11 are covered with the second part 13b and the third part 13c of the first insulating layer 13 like the capacitor 100 of the first embodiment shown in FIG. 3. On the other hand, the side surface 12b on a right side of the first conductive layer 12 may be covered with the first insulating layer 13A like the second Embodiment shown in FIG. 5, or may be covered with the first insulating layer 13B like the third Embodiment shown in FIG. 6.

(3) In the capacitor in each of the above embodiments, a layer not shown in the diagram may be formed between the substrate 11 and the first conductive layer 12, between the first conductive layer 12 and the first insulating layer 13, or between the first insulating layer 13 and the second conductive layer 14.

(4) According to the present disclosure, through electrode substrates such as shown below may be provided.

According to the present disclosure, a through electrode substrate is provided, the through electrode including: a substrate having a first surface and a second surface facing the first surface; a through electrode penetrating through the substrate; a first conductive layer arranged on the first surface of the substrate and electrically connected with the through electrode; an insulating layer arranged on the first conductive layer; and a second conductive layer arranged on the insulating layer, wherein the insulating layer includes a first part arranged between the first conductive layer and second conductive layer, and a second part covering at least a part of a side surface of the first conductive layer.

According to the present disclosure, in the through electrode substrate, a thickness of the first part of the insulating layer may be 200 nm to 400 nm, and a thickness of the second part of the insulating layer may be 50 nm to 100 nm.

According to the present disclosure, in the through electrode substrate, the insulating layer may further include a third part extending from the second part and covering at least a part of the first surface of the substrate.

According to the present disclosure, in the through electrode substrate, a thickness of the third part of the insulating layer may be 50 nm to 200 nm.

According to the present disclosure, the through electrode substrate may further include a ground layer arranged between the substrate and the first conductive layer, the ground layer having a recess part intruding more inside than the side surface of the first conductive layer.

According to the present disclosure, in the through electrode substrate, the third part of the insulating layer may be arranged so as to fill the recess part.

According to the present disclosure, in the through electrode substrate, the third part of the insulating layer may be arranged so as to form a space in the recess part.

According to the present disclosure, in the through electrode substrate, the insulating layer may further include a fourth part connected to the third part and extending in a direction intersecting with the first surface of the substrate.

According to the present disclosure, the through electrode substrate may further include an intermediate layer between the first conductive layer and the insulating layer.

According to the present disclosure, in the through electrode substrate, a length of the third part may be 20 µm or larger.

According to the present disclosure, in the through electrode substrate, a height of the fourth part may be 25 µm or larger.

According to the present disclosure, in the through electrode substrate, at least one of the first conductive layer, the insulating layer, and the second conductive layer has a corner part of a round shape in plan view.

According to the present disclosure, in the through electrode substrate, the second part of the insulating layer may be formed of a material different from the first part.

According to the present disclosure, in the through electrode substrate, a material of the second part may be an insulating resin.

According to the present disclosure, the through electrode substrate may further include a resin layer arranged on the first surface, an annular conductive layer formed along an end part of the resin layer, and an annular insulating layer arranged between the annular conductive layer and the first surface, a width of the annular insulating layer being larger than that of the annular conductive layer.

According to the present disclosure, a manufacturing method of a through electrode substrate is provided, the manufacturing method including: providing a substrate having a first surface and a second surface facing the first surface and including a through hole penetrating through the first surface and the second surface; forming a through electrode conducting between the first surface and the second surface in the through hole of the substrate, and a first conductive layer electrically connected with the through electrode on the first surface of the substrate; forming a first insulating layer on an upper surface of the first conductive layer; forming a second insulating layer so as to cover at least a part of a side surface of the first conductive layer and the first insulating layer; removing a part of the second insulating layer located on the upper side of the first conductive layer; and forming a second conductive layer on the removed part of the second insulating layer.

According to the present disclosure, in the manufacturing method of the through electrode substrate, the second insulating layer may be a photosensitive resin, and the removing may be applied by photolithography.

According to the present disclosure, in the manufacturing method of a through electrode substrate, the forming the second insulating layer may include, after coating the second insulating layer under a first pressure, arranging the substrate under a second pressure higher than the first pressure is included.

According to the present disclosure, a manufacturing method of a through electrode substrate is provided, the manufacturing method including: providing a substrate having a first surface and a second surface facing the first surface and including a through hole penetrating through the first surface and the second surface; forming a first resist on the first surface; forming a through electrode conducting between the first surface and the second surface in the through hole of the substrate, and a first conductive layer electrically connected with the through electrode on the first surface of the substrate; forming an intermediate layer on the first conductive layer; removing the first resist by lift-off; forming a second resist in the surrounding of the first conductive layer; forming a first insulating layer on an upper surface and a side surface of the intermediate layer, a side surface of the first conductive layer, the first surface, and an upper surface and a side surface of the second resist; removing the second resist by the lift-off so as to leave at least a part of the first insulating layer formed on the side surface of the second resist; and forming a second conductive layer on the first insulating layer corresponding to a position of the intermediate layer.

According to the present disclosure, a manufacturing method of a through electrode substrate is provided, the manufacturing method including: providing a substrate having a first surface and a second surface facing the first surface and having a through hole penetrating through the first surface and the second surface; forming a first resist on the first surface; forming a through electrode that makes the first surface and the second surface electrically conductive in the through hole of the substrate, and a first conductive layer electrically connected with the through electrode on the first surface of the substrate; forming a first insulating layer on an upper surface and a side surface of the first conductive layer, and the first surface; forming a second conductive layer on the first insulating layer corresponding to a position of the upper surface of the first conductive layer; forming a second resist layer so as to cover the second conductive layer and cover a part of the first insulating layer on the first surface; removing a part of the first insulating layer that is not covered by the second resist layer; and removing the second resist layer.

According to the present disclosure, the manufacturing method may further include forming a resin layer on the first surface, the forming the second conductive layer may include forming an annular conductive layer on the first insulating layer along a position where an end part of the resin layer is formed, and the forming the second resist layer may include forming the second resist layer, a width of the second resist layer being larger than that of the annular conductive layer.

In addition, the through electrode substrate may be used also as an interposer.

What is claimed is:

1. A through electrode substrate comprising:
a substrate having a first surface and a second surface facing the first surface;
a through electrode penetrating through the substrate; and
a capacitor including a first conductive layer, an insulating layer, and a second conductive layer, arranged on the first surface side of the substrate, and electrically connected with the through electrode,
wherein
the insulating layer includes a first part and a second part and is arranged on the first conductive layer,
the second conductive layer is arranged on the insulating layer,
the first part is arranged between the first conductive layer and the second conductive layer,
the second part covers at least a part of a side surface of the first conductive layer,
at least a part of the through electrode and the first conductive layer are integrated to form a structure, and
a part of an inner surface of the through electrode is covered with the insulating layer extending from the capacitor.

2. The through electrode substrate according to claim 1, wherein a thickness of the second part of the insulating layer is 1/4 or larger and 1/2 or smaller a thickness of the first part of the insulating layer.

3. The through electrode substrate according to claim 1, wherein
the insulating layer further includes a third part extending from the second part and covering at least a part of the first face of the substrate.

4. The through electrode substrate according to claim 3, wherein
the second conductive layer is arranged over the first part, the second part, and the third part of the insulating layer.

5. The through electrode substrate according to claim 3, wherein
the insulating layer further includes a fourth part being connected to the third part and extending outwardly from the substrate.

6. The through electrode substrate according to claim 1, wherein
the second part of the insulating layer is formed of the same material as the first part and extends continuously from the first part.

7. The through electrode substrate according to claim 1, wherein
the substrate includes a glass substrate.

8. The through electrode substrate according to claim 1, wherein
the insulating layer has a part connecting with the second part and covering at least a part of the through electrode.

9. The through electrode substrate according to claim 1, wherein
the second conductive layer is constituted of a plurality of mutually separated conductive parts.

10. The through electrode substrate according to claim 1, further comprising an inductor electrically connected with the capacitor, wherein
the inductor is constituted by including the through electrode.

11. The through electrode substrate according to claim 10, wherein
a thickness of the first conductive layer is 5 µm to 20 µm, and a thickness of the through electrode constituting the inductor is 5 µm to 20 µm.

12. The through electrode substrate according to claim 1, further comprising a resin layer covering the capacitor, wherein
a specific permittivity of the insulating layer is larger than that of the resin layer.

13. A semiconductor device comprising:
the through electrode substrate according to claim 1;
a semiconductor chip arranged on the first surface side of the substrate of the through electrode substrate and electrically connected with the through electrode; and
a wiring board arranged on the second surface side of the substrate and electrically connected with the through electrode.

14. A semiconductor device comprising:
the through electrode substrate according to claim 1;
a wiring board arranged on the second surface side of the substrate of the through electrode substrate and electrically connected with the through electrode; and
a semiconductor chip electrically connected with the wiring board, a position of the semiconductor chip being different from that of the through electrode substrate on the wiring board.

15. The through electrode substrate according to claim 1, wherein the inner surface of the through electrode is inside of conductive material penetrating through the substrate.

* * * * *